(12) United States Patent
Frei et al.

(10) Patent No.: US 12,328,983 B2
(45) Date of Patent: Jun. 10, 2025

(54) OPTOELECTRONIC ARRANGEMENT

(71) Applicant: OSRAM Opto Semiconductors GmbH, Regensburg (DE)

(72) Inventors: Ulrich Frei, Regensburg (DE); Ludwig Hofbauer, Regenstauf (DE); Michael Brandl, Mintraching (DE); Rainer Huber, Bad Abbach (DE); Sebastian Wittmann, Regenstauf (DE); Peter Brick, Regensburg (DE); Ulrich Streppel, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 298 days.

(21) Appl. No.: 17/615,764

(22) PCT Filed: Oct. 29, 2020

(86) PCT No.: PCT/EP2020/080472
§ 371 (c)(1),
(2) Date: Dec. 1, 2021

(87) PCT Pub. No.: WO2021/110331
PCT Pub. Date: Jun. 10, 2021

(65) Prior Publication Data
US 2022/0310893 A1    Sep. 29, 2022

(30) Foreign Application Priority Data

Dec. 6, 2019 (DE) .................... 10 2019 133 448.9
Feb. 21, 2020 (DK) ............................ PA202070106
(Continued)

(51) Int. Cl.
*H10H 20/857* (2025.01)
*H05B 45/18* (2020.01)

(52) U.S. Cl.
CPC .......... *H10H 20/857* (2025.01); *H05B 45/18* (2020.01)

(58) Field of Classification Search
CPC ......... G06F 3/044; H01L 33/62; H05B 45/18; B32B 17/10541; B32B 2333/12; B32B 17/10036; B60R 16/037; H10H 20/857
See application file for complete search history.

(56) References Cited

U.S. PATENT DOCUMENTS 8,474,860 B2    7/2013 Ohoka et al.
8,924,076 B2 *  12/2014 Boote ............... B32B 17/10174
                                              701/36
(Continued)

FOREIGN PATENT DOCUMENTS

CN        1675446 A     9/2005
CN      108877521 A    11/2018
(Continued)

OTHER PUBLICATIONS

International Search Report and Written Opinion issued in corresponding International Application No. PCT/EP2020/080472 dated Feb. 10, 2021.

*Primary Examiner* — Hong Zhou
(74) *Attorney, Agent, or Firm* — ArentFox Schiff LLP

(57) ABSTRACT

Optoelectronic arrangement is proposed for use in a transparent glazing element of a vehicle, for example. The arrangement comprises at least one substantially transparent carrier layer, at least one conductor layer comprising conductor paths provided on at least one side of said carrier layer, at least one light emitting element arranged on the carrier layer and electrically coupled to conductor paths on said conductor layer and at least one proximity and/or touch sensor arranged on at least one of said carrier layers, the arrangement further being couplable to a control module for controlling the operation of said at least one light emitting (Continued)

element in response to information from said at least one proximity and/or touch sensor.

20 Claims, 20 Drawing Sheets

(30) Foreign Application Priority Data

Sep. 4, 2020 (DE) ..................... 10 2020 123 227.6
Sep. 4, 2020 (DE) ..................... 10 2020 123 229.2

(56) References Cited

U.S. PATENT DOCUMENTS

| | | |
|---|---|---|
| 9,806,281 B2 | 10/2017 | Domercq et al. |
| 10,395,589 B1 | 8/2019 | Vahid Far et al. |
| 11,179,032 B2 | 11/2021 | Chen et al. |
| 11,569,411 B2 | 1/2023 | Volpert |
| 11,682,607 B2 | 6/2023 | We et al. |
| 2002/0118321 A1 | 8/2002 | Ge |
| 2002/0140629 A1 | 10/2002 | Sundahl |
| 2002/0149312 A1 | 10/2002 | Roberts et al. |
| 2004/0185195 A1 | 9/2004 | Anderson et al. |
| 2005/0238857 A1 | 10/2005 | Day |
| 2005/0253244 A1 | 11/2005 | Chang |
| 2006/0116046 A1 | 6/2006 | Morley et al. |
| 2006/0275599 A1* | 12/2006 | Lefevre ............. B32B 17/10018 428/332 |
| 2007/0014469 A1 | 1/2007 | Paillet et al. |
| 2009/0016095 A1 | 1/2009 | Thomas et al. |
| 2009/0021181 A1* | 1/2009 | Brune ................... H05B 45/12 315/291 |
| 2009/0103298 A1 | 4/2009 | Boonekamp et al. |
| 2009/0114928 A1 | 5/2009 | Messere et al. |
| 2009/0231882 A1 | 9/2009 | Lin et al. |
| 2009/0279295 A1 | 11/2009 | Van Der Poel |
| 2010/0060821 A1 | 3/2010 | Wang et al. |
| 2010/0140655 A1 | 6/2010 | Shi |
| 2010/0176705 A1 | 7/2010 | Van Herpen et al. |
| 2011/0006316 A1 | 1/2011 | Ing et al. |
| 2011/0127552 A1 | 6/2011 | Van Herpen et al. |
| 2011/0317417 A1 | 12/2011 | Gourlay |
| 2013/0016494 A1 | 1/2013 | Speier et al. |
| 2014/0091326 A1* | 4/2014 | Tran ....................... H01L 31/18 438/25 |
| 2014/0096893 A1 | 4/2014 | Veerasamy |
| 2014/0234578 A1 | 8/2014 | Decraye et al. |
| 2015/0239399 A1 | 8/2015 | Tonar et al. |
| 2015/0253486 A1 | 9/2015 | Verger et al. |
| 2015/0301175 A1* | 10/2015 | Rao ...................... G01J 1/1626 701/49 |
| 2015/0308639 A1 | 10/2015 | Keranen et al. |
| 2016/0154170 A1 | 6/2016 | Thompson et al. |
| 2016/0313587 A1 | 10/2016 | Linthout et al. |
| 2017/0005077 A1 | 1/2017 | Kim et al. |
| 2017/0212633 A1 | 7/2017 | You et al. |
| 2017/0301282 A1 | 10/2017 | Rotzoll et al. |
| 2017/0309698 A1 | 10/2017 | Bower et al. |
| 2017/0373268 A1 | 12/2017 | Takahashi et al. |
| 2018/0141487 A1 | 5/2018 | Osumi et al. |
| 2018/0301594 A1 | 10/2018 | Bouvier et al. |
| 2018/0311935 A1 | 11/2018 | Sahyoun et al. |
| 2018/0323180 A1 | 11/2018 | Cok |
| 2018/0343741 A1 | 11/2018 | Williams et al. |
| 2018/0345631 A1* | 12/2018 | Klein ............... B32B 17/10761 |
| 2018/0370195 A1 | 12/2018 | Laluet et al. |
| 2018/0374834 A1 | 12/2018 | Tada et al. |
| 2019/0001629 A1 | 1/2019 | Laluet |
| 2019/0016095 A1 | 1/2019 | Labrot et al. |
| 2019/0019968 A1 | 1/2019 | He et al. |
| 2019/0096864 A1 | 3/2019 | Huitema et al. |
| 2019/0134952 A1 | 5/2019 | Varnasi et al. |
| 2019/0140154 A1* | 5/2019 | Ohmae ..................... G09F 9/33 |
| 2019/0160792 A1* | 5/2019 | Weber ............... B32B 17/10192 |
| 2019/0179458 A1* | 6/2019 | Weber ................ B32B 17/1022 |
| 2019/0193376 A1 | 6/2019 | Bauerle |
| 2019/0248122 A1 | 8/2019 | Gillessen et al. |
| 2019/0255813 A1* | 8/2019 | Bauerle ............ B32B 17/10036 |
| 2019/0279558 A1 | 9/2019 | Monestier et al. |
| 2019/0299852 A1 | 10/2019 | Bauerle et al. |
| 2019/0377125 A1 | 12/2019 | Liu et al. |
| 2020/0006456 A1 | 1/2020 | Zhang et al. |
| 2020/0012848 A1 | 1/2020 | Goto |
| 2020/0144228 A1 | 5/2020 | Brick |
| 2020/0269815 A1* | 8/2020 | Day ..................... B60S 1/0837 |
| 2020/0350361 A1 | 11/2020 | Tao et al. |

FOREIGN PATENT DOCUMENTS

| | | |
|---|---|---|
| CN | 109801568 A | 5/2019 |
| DE | 102007039416 A1 | 2/2009 |
| DE | 102012213343 A1 | 1/2014 |
| DE | 102013102003 A1 | 8/2014 |
| DE | 202015009229 U1 | 12/2016 |
| DE | 102017122852 A | 4/2019 |
| DE | 102017122852 A1 | 4/2019 |
| DE | 102018119376 A1 | 2/2020 |
| DE | 112018003398 T5 | 3/2020 |
| EP | 1760784 A2 | 3/2007 |
| EP | 1886804 A1 | 2/2008 |
| EP | 2412521 A1 | 2/2012 |
| EP | 2760108 A1 | 7/2014 |
| EP | 3264241 A1 | 1/2018 |
| EP | 3264242 A1 | 1/2018 |
| FR | 3044972 A1 | 6/2017 |
| JP | 08-130330 A | 5/1996 |
| JP | 10-240172 A | 9/1998 |
| JP | 2001-022300 A | 1/2001 |
| JP | 2003-337556 A | 11/2003 |
| JP | 2004-327955 A | 11/2004 |
| JP | 2005-310751 A | 11/2005 |
| JP | 2005-534612 A | 11/2005 |
| JP | 2007-073734 A | 3/2007 |
| JP | 2009-512977 A | 3/2009 |
| JP | 2009-535798 A | 10/2009 |
| JP | 2010-520627 A | 6/2010 |
| JP | 2010521353 A | 6/2010 |
| JP | 2010-170969 A | 8/2010 |
| JP | 2012-195404 A | 10/2012 |
| JP | 2014-060320 A | 4/2014 |
| JP | 2015-084374 A | 4/2015 |
| JP | 2016-167451 A | 9/2016 |
| JP | 2017-212384 A | 11/2017 |
| JP | 2019-009192 A | 1/2019 |
| JP | 2019-134025 A | 8/2019 |
| JP | 2020-017730 A | 1/2020 |
| KR | 10-2014-0071796 A | 6/2014 |
| WO | 2007093823 A1 | 8/2007 |
| WO | 2008058881 A1 | 5/2008 |
| WO | 2009087584 A1 | 7/2009 |
| WO | 2009125918 A2 | 10/2009 |
| WO | 2011158185 A1 | 12/2011 |
| WO | 2012/036081 A1 | 3/2012 |
| WO | 2014141019 A1 | 9/2014 |
| WO | 201478942 A1 | 11/2014 |
| WO | 2016095117 A1 | 6/2016 |
| WO | 2018025051 A1 | 2/2018 |
| WO | 2019008493 A1 | 1/2019 |
| WO | 2019/026858 A1 | 2/2019 |
| WO | 2019048893 A1 | 3/2019 |
| WO | 2019088493 A1 | 5/2019 |
| WO | 2019091728 A1 | 5/2019 |
| WO | 2019146634 A1 | 8/2019 |
| WO | 2019160199 A1 | 8/2019 |
| WO | 2019186513 A1 | 10/2019 |
| WO | 2020050062 A1 | 3/2020 |
| WO | 2020071815 A1 | 4/2020 |

* cited by examiner

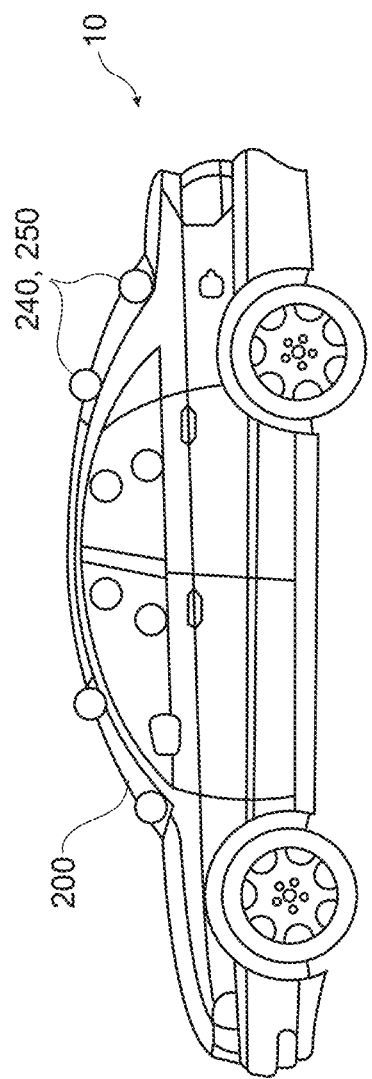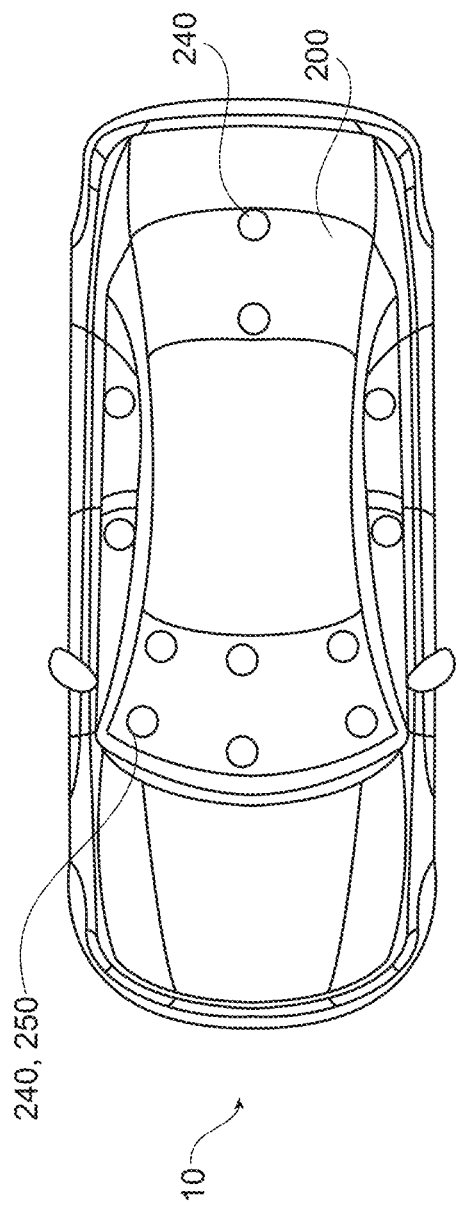

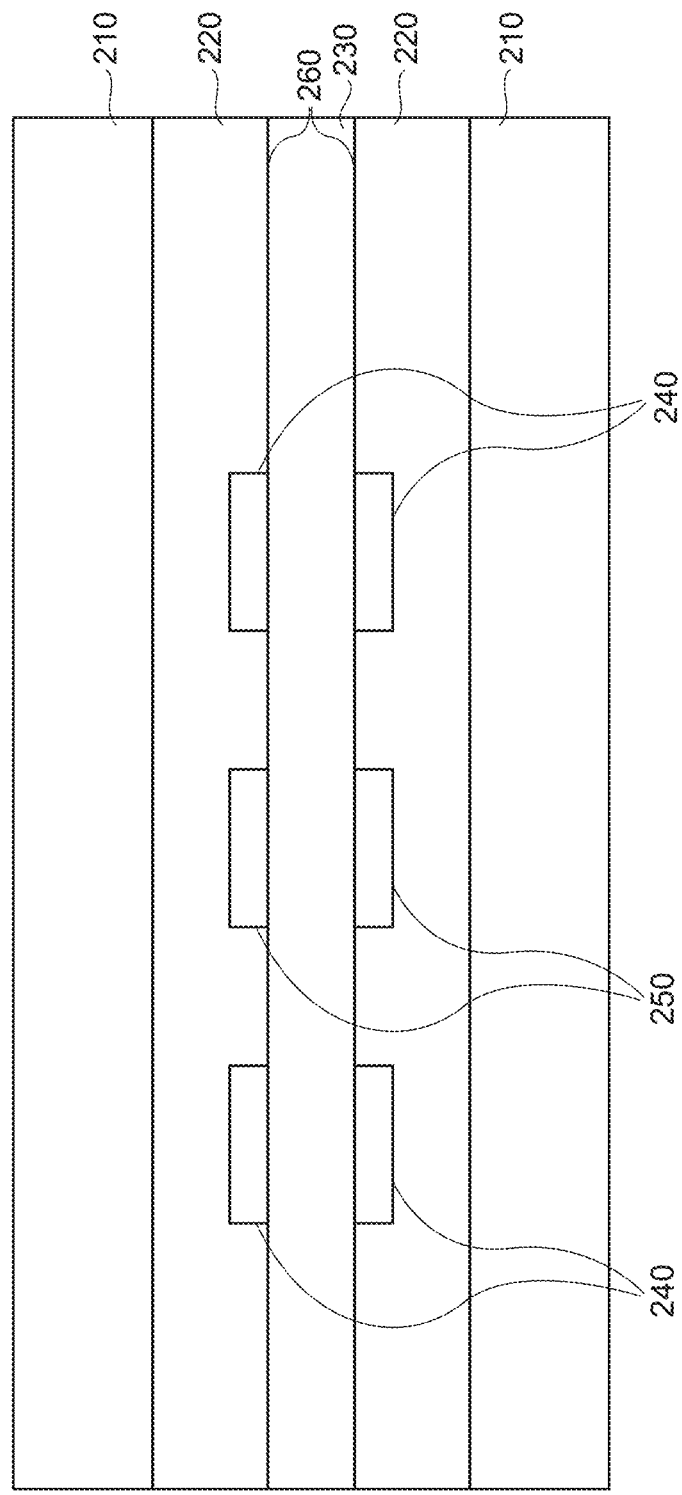

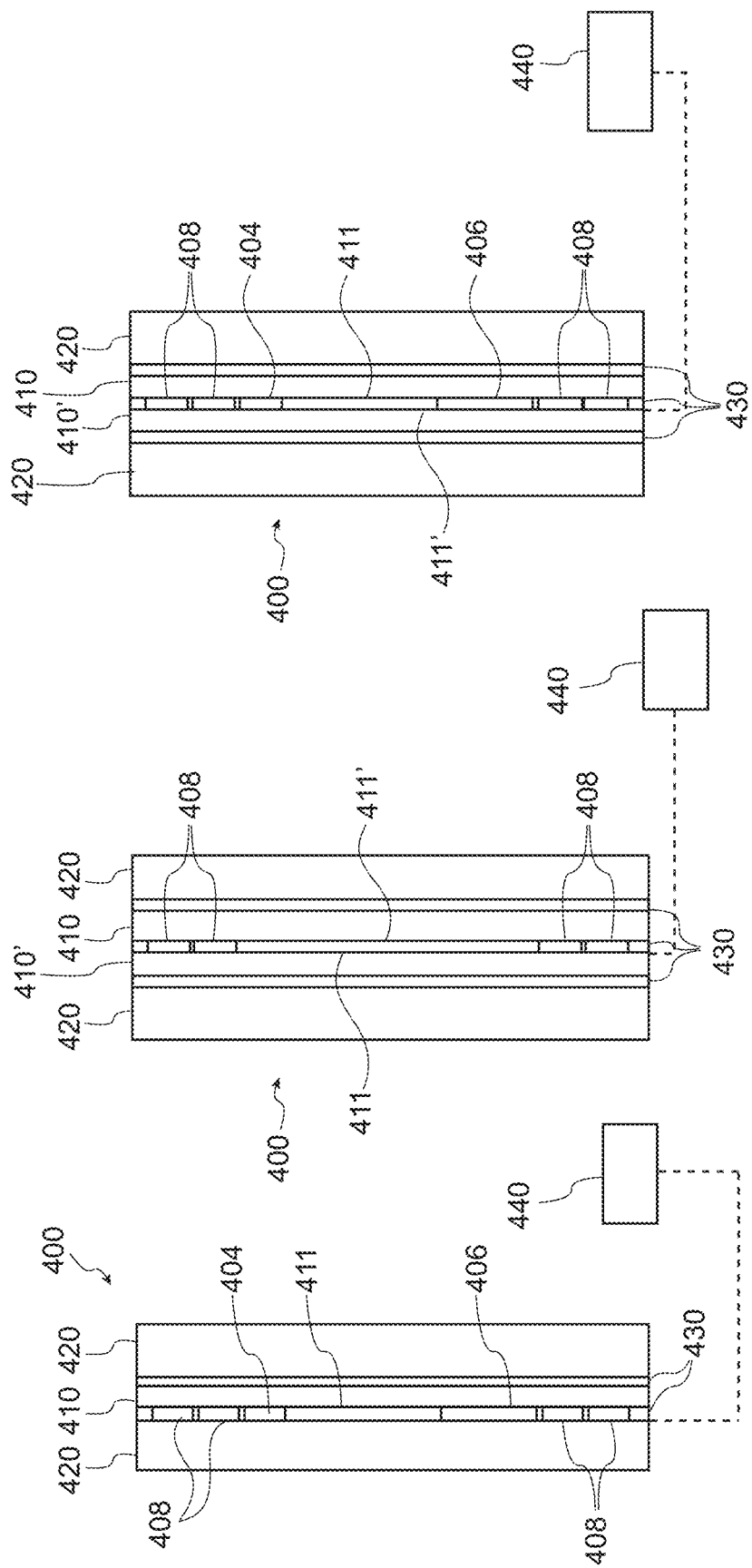

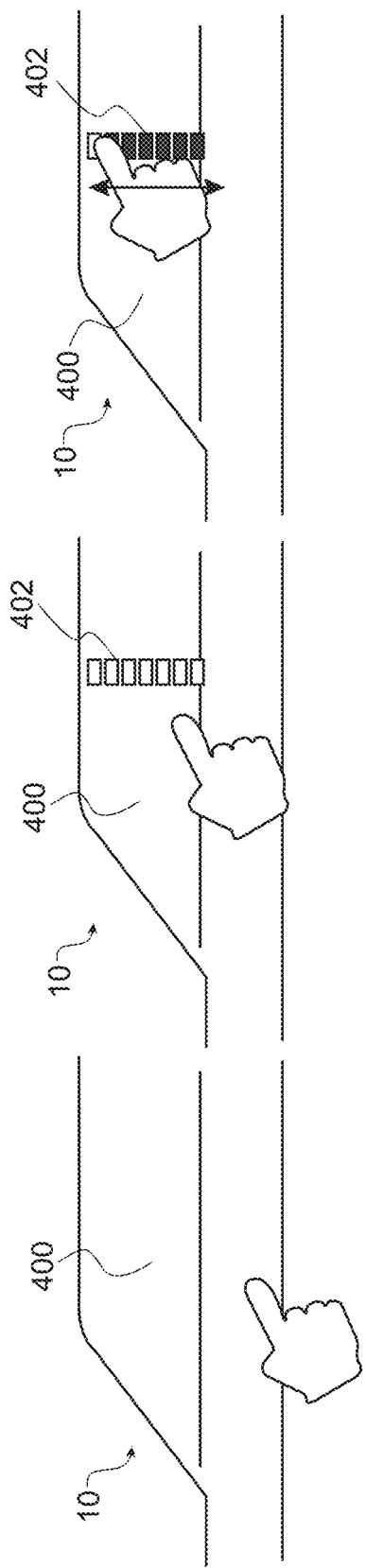

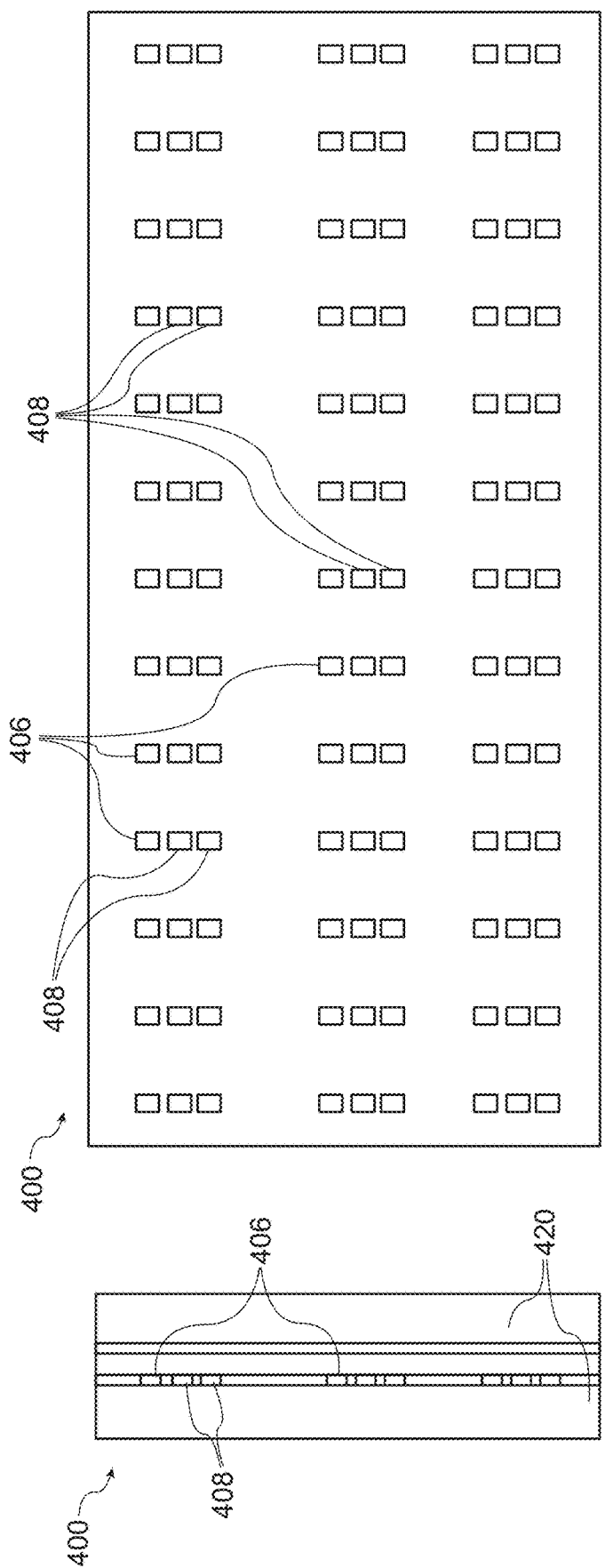

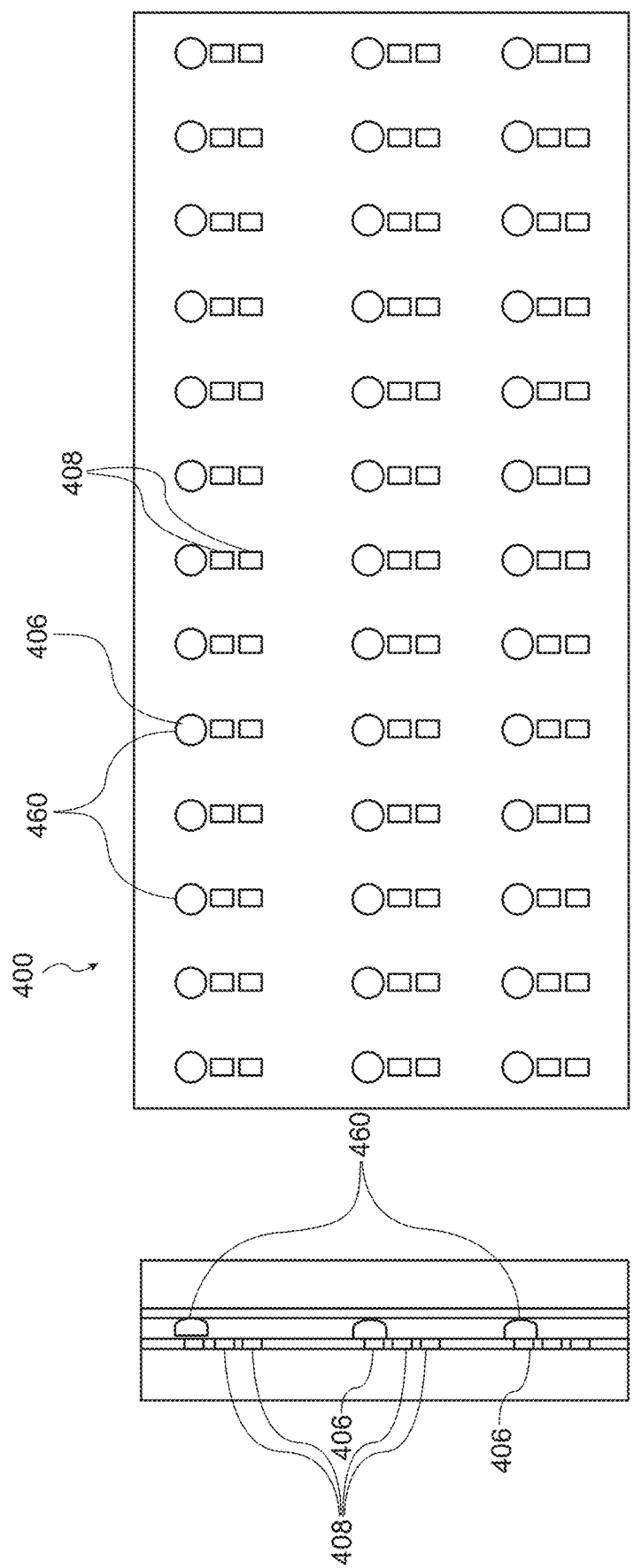

OPTOELECTRONIC ARRANGEMENT

The present application is a U.S.C. 371 National Stage entry of PCT Application No. PCT/EP2020/080472 filed Oct. 29, 2020, which claims priority from claims priority from DE application No. 10 2019 133 448.9 dated Dec. 6, 2019, DK application No. PA202070106 dated Feb. 21, 2020, DE application No. 10 2020 123 227.6 dated Sep. 4, 2020, and DE application No. 10 2020 123 229.2 dated Sep. 4, 2020, the disclosures of which are incorporated herein in their entirety.

The present invention concerns optoelectronic arrangements in substantially transparent laminate structures for use in glazing, particularly in vehicles. The present invention further concerns a photoelectric sensor system for monitoring a space, particularly the space inside and outside an automotive vehicle and providing a 3D mapping of objects within the space.

BACKGROUND

Photoelectric monitoring systems play an important role in today's automotive industry for safety applications and driver assistance. One area that has attracted interest is the monitoring of the cabin or interior of a vehicle and also determining various characteristics of the driver. A problem with deploying sensor systems for such applications is the location of the systems within different interiors in a way that is discrete and yet has a good line of sight.

In the light of these problems, it is an object of the present invention to provide a sensor system capable of providing a 3D mapping of a space that has a well-defined position regardless of the vehicle type. It is a further object to provide such a sensor system that can be easily deployed in different vehicle types.

In addition there is a need for monitoring and or displaying information to occupants of vehicles as well as to persons outside, and this need extends to other partially or completely enclosed spaces, such as buildings.

DE 10 2017 122 852 A1 discloses a cover for a motor vehicle roof, comprising a layer stack. The layer stack comprises a pane, which extends in a planar manner, a film, which extends in a planar manner, and an adhesive layer arranged between the pane and the film for fastening the film to the pane. A plurality of micro light emitting diodes is arranged in the adhesive layer. DE 10 2017 122 852 A1 also discloses a motor vehicle, comprising a motor vehicle roof having such a cover.

US 2019/0248122 A1 discloses a method for producing a composite pane for a motor vehicle. The method comprises providing a first pane and a second pane. The method further includes arranging a plastic film between the first pane and the second pane, and arranging a light emitting diode (LED) on a surface of the plastic film. Moreover, the method comprises locally heating the plastic film at least in a region of the LED into a fluid state by means of a heating source positioned on an outer surface of the first pane or the second pane or arranged at a distance from the outer surface of the first pane or the second pane. Additionally, the method comprises introducing the LED into the plastic film heated into the fluid state with displacement of a predefined volume of the plastic film, and the method includes after introducing the LED into the plastic film, laminating the first pane and the second pane with the interposed plastic film.

WO 2019/186513 A1 discloses a laminated automotive glazing, which comprises an outer glass layer, an inner glass layer, at least one plastic interlayer between the outer and inner glass layers, and at least one camera system, wherein the camera system is laminated between the glass layers as an integral permanent part of the laminate.

WO 2019/008493 A1 discloses a vehicle laminate comprising an exterior glass layer, at least an inner glass layer, at least one plastic bonding layer located between the exterior glass layer and the inner glass layer, at least one LED embedded into the plastic bonding layer. A wire is substantially embedded in the plastic bonding layer forming a circuit to power the LED.

It is an object of the present invention to provide an improved optoelectronic arrangement, in particular an at least partially transparent optoelectronic device, which provides an improved functionality. In some aspects, the present invention also seeks to integrate electronic or optoelectronic component, such as for example light sources and/or sensors into at least partially transparent panes, in particular of vehicles.

SUMMARY

The above and further objects are achieved in a monitoring system as defined in the appended items.

More specifically, the invention resides in a monitoring system for monitoring the space inside and/or outside a motor vehicle comprising a plurality of photoelectric sensor elements adapted to generate a 3-dimensional mapping of objects in said space, said sensor elements being electrically connected to a substantially transparent carrier layer adapted to be disposed between first and second substantially transparent layers to form a substantially transparent laminate structure for use in one or more windows and/or roof panel of said motor vehicle.

Providing a plurality of sensors on a carrier that can be integrated within a transparent laminate structure serving as windows and/or roof panel means that the sensor system can be spread around a large well-defined surface of the motor vehicle. This, in turn, allows the sensors to be positioned optimally to view passenger positions inside the vehicle for safety applications, recognise the driver inside the vehicle to control the vehicle start or select driver preferences and recognise a driver standing outside the vehicle to control the door locks.

The possible applications are still greater when, in accordance with a preferred embodiment of the invention, the sensor elements are disposed on said carrier layer in a 2-dimensional arrangement.

According to one embodiment of the invention, the sensor elements are configured to monitor a space using at least one of triangulation, structured light and time-of-flight.

Preferably, the sensor elements, when mounted in said laminate structure in a motor vehicle, are arranged to generate a three-dimensional detection zone inside and/or outside said motor vehicle.

According to a preferred embodiment, the sensor elements are mounted on the carrier layer. In an alternative embodiment, the sensor elements are embedded in the carrier layer, which allows the resultant laminate to be thinner.

A bonding layer may provided between the carrier layer and at least one of said first and second layers. Alternatively, the carrier layer may act as a bonding layer between the first and second layers.

Preferably, the carrier layer is flexible and comprises wiring for power supply and signal carrier of said sensors. In this way, the sensor system can be easily deployed in different parts of a vehicle and be adapted to different vehicle types. The sensor system may also occupy a large surface, if required.

In a preferred embodiment, the sensors comprise photoelectric emitter elements and photoelectric detector elements, each of which preferably comprises at least one lens adapted to provide a directional field of view.

In a still further advantageous embodiment the sensors comprise image processing and control circuitry for controlling at least one photoelectric emitter element and/or photoelectric detector element. Enabling the integration of image processing and control circuitry in the laminate structure further simplifies the deployment of the system to different vehicle types.

In a particularly preferred embodiment of the present invention, the sensors have dimensions no greater than 500 μm, and preferably no greater than 200 μm. Limiting the components to this size ensures that they are virtually imperceptible to the occupants of the vehicle and allows the sensors to be placed in any position on windows or roof panels.

The present invention further resides in a transparent laminate structure for use in the windows and/or roof panel of a motor vehicle comprising a monitoring system as set out above and described here below and also in a vehicle comprising such a transparent laminate structure, preferably in at least two of a side window, a rear window, a front window and a roof panel of said motor vehicle, to ensure sufficient coverage for enabling the effective 3D mapping of the interior.

In some embodiments of the present invention an optoelectronic arrangement is proposed for use in a transparent glazing element of a vehicle, for example. The optoelectronic arrangement comprises a substantially transparent carrier layer, at least one conductor layer comprising conductor paths provided on at least one side of said carrier layer, optoelectronic components comprising at least a plurality of LEDs arranged on the carrier layer and electrically coupled to conductor paths on said conductor layer and means for determining the temperature of at least one of the LEDs.

In some embodiments the optoelectronic arrangement comprises means for adjusting operational parameters of the optoelectronic components and at least the LEDs in response to the determined temperature. For example, the adjusting means may modify the current supplied to the LEDs to correct or modify the LED colour and/or to prolong the lifespan of the LED.

In an embodiment of the optoelectronic the means for determining the temperature of at least one LED comprises at least one temperature sensor arranged on at least one side of said carrier layer and electrically coupled to conductor paths on said conductor layer.

In an embodiment, a reflector is arranged around the temperature sensor for reflecting heat and/or light away from the carrier layer.

In an embodiment of the invention, the distance between the temperature sensor and the said at least one LED is at most 5 cm, preferably at most 1cm and still more preferably at most 0.5 cm.

In an embodiment of the invention the means for determining the temperature of at least one LED comprises means for measuring a forward voltage (Vf) of at least one LED.

In some embodiments of the invention, the means for determining the temperature of at least one LED comprises means for measuring conductivity of conductor paths in the conductor layer.

In an embodiment of the invention, the optoelectronic arrangement comprises at least one substantially transparent outer layer and at least one substantially transparent intermediate layer disposed between the carrier layer and said at least one outer layer.

In an embodiment of the invention, the carrier layer is thermally insulating. In a further embodiment of the invention, the carrier layer comprises two layers separated by a thermally insulating layer.

In an embodiment of the invention, the plurality of LEDs are arranged on both sides of said carrier layer.

In some embodiments of the invention, at least one photodetector is mounted on at least one side of said carrier layer for providing signals indicative of the light intensity incident on said optoelectronic arrangement.

In an embodiment of the invention the optoelectronic arrangement comprises a directional structure arranged over said photodetector for channeling light to said photodetector as a function of the direction of light received.

In some embodiments of the invention, the optoelectronic arrangement comprises a directional structure arranged over at least one LED, said directional structure being configured to channel light from said LED in predetermined directions.

The present invention further resides in a carrier layer for use in substantially transparent laminate structure forming a glazing element suitable for a vehicle, in a vehicle comprising such an optoelectronic arrangement and in a method of operating the optoelectronic arrangement.

Embodiments of the present invention include an optoelectronic arrangement for use in a transparent glazing element of a vehicle, for example, the optoelectronic arrangement comprising at least one substantially transparent carrier layer, at least one conductor layer comprising conductor paths provided on at least one side of said carrier layer, at least one light emitting element arranged on the carrier layer and electrically coupled to conductor paths on said conductor layer and at least one proximity sensor and/or touch sensor arranged on at least of said carrier layers, the arrangement further being couplable to a control module for controlling the operation of said at least one light emitting element in response to information from said at least one proximity and/or touch sensor. By controlling the one or more light emitting elements in response to information from the proximity sensor and/or the touch sensor, the optoelectronic arrangement becomes interactive and responsive to movement towards the arrangement and possibly also to touch of the arrangement. Such an arrangement finds application in glazing elements of a car, such as windshield, side window or roof panel, but also in static window advertisements or transparent information planes.

In some embodiments, the proximity sensor comprises at least one infrared emitter and at least one infrared detector.

Preferably, the touch sensor comprises a capacitive touch sensor.

In an embodiment of the present invention, the optoelectronic arrangement comprises at least one substantially transparent carrier layer having conductor strips serving as a capacitive touch sensor.

In some embodiments of the present invention, the control unit is at least partially mounted on at least one carrier layer.

In preferred embodiments of the present invention, the light emitting element comprises an LED, preferably a microLED.

In some embodiments of the invention, the light emitting element comprises a laser.

Preferably, the optoelectronic arrangement comprises at least one ambient light detector mounted on said at least one carrier layer, said control unit being configured to control the illuminance of said light emitting element in response to signals from said at least one ambient light detector.

In some embodiments of the present invention, at least one light emitting element and at least one proximity sensor are arranged in a group, said control unit being configured to control the operation of the light emitting element of each group in response to signals from the at least one proximity sensor of the same group.

In preferred embodiments of the present invention, the groups comprise at least one ambient light detector, the control unit being configured to control the illuminance of the light emitting elements of a group in response to a signal from an ambient light detector of the same group.

In some embodiments of the invention, the optoelectronic arrangement comprises lens structures arranged over at least one of said proximity sensors.

In a preferred embodiment of the present invention, at least one optical layer is bonded to the carrier layer over the light emitting elements for diffusing light from each light emitting element into a light patch of substantially uniform illuminance and of greater diameter than the light emitting element.

In some embodiments, the optical layer comprises an array of optical segments on an input surface and an array of optical segments on and output surface, wherein the segments on the output surface are larger than the segments on the input surface.

Preferably, the side dimensions of said light emitting elements, proximity sensors and touch sensors are ≤300 µm.

In some embodiments, the at least one carrier layer is flexible and preferably made of a thermoplastic.

Preferably, the at least one conductor layer is of a substantially transparent metal oxide such as ITO.

Another aspect of the present invention includes a vehicle comprising at least one optoelectronic arrangement as claimed and described herein.

In some embodiments, the optoelectronic arrangement, laminate structure, or monitoring system comprises a carrier layer, also referred to as carrier film, as well as a front and a rear layer, also referred to as cover layers or outer layers. The carrier layer can be arranged between two cover layers. The carrier layer can carry the at least one emitter element, also referred to as LED, and/or the at least one detector element, also referred to as photodetector or temperature sensor. In some embodiments, the at least one emitter element and/or detector element can be partially or completely embedded in the carrier layer.

In some embodiments, the carrier layer can at least be partially transparent and comprise or consist of a material, such as high or low grade polyethylene terephthalate (PET), polyethylene naphthalate (PEN), polycarbonates (PC), (colorless) polyimide (PI), polyurethane (PU), poly(methyl methacrylate) (PMMA), polycyclic aromatic hydrocarbons (PAK), or any other suitable material. Particularly, the carrier layer can comprise or consist of an at least partially transparent plastic, in particular an at least partially transparent foil, in particular a flexible foil.

Each of the front layer and the rear layer may be made of a glass material, a plastic material and/or any other suitable material. Each of the front layer and the rear layer may contain only one layer or several layers of the same or different materials.

In some embodiments, the optoelectronic arrangement, laminate structure, or monitoring system further comprises at least one laminating layer, which also is referred to as bonding layer. A first laminating layer can be arranged between the carrier layer and the front layer and optionally a second laminating layer can be arranged between the carrier layer and the rear layer.

The at least one laminating layer can be formed by one of the following:
a molten material layer or
an adhesive layer, in particular a hot-melt adhesive layer,
a resin, such as Ethylene Vinyl Acetate (EVA), Polyvinyl Butyral (PVB), or
a ionomer based system.

In some embodiments, the at least one laminating layer can enclose the carrier layer in the same layer. The at least one laminating layer can have the same height as the carrier layer, however the at least one laminating layer can also have a height which is different, in particular larger, than the height of the carrier layer. The at least one laminating layer can enclose the carrier layer not only in a circumferential direction, since the carrier layer can be completely embedded in the at least one laminating layer.

In some embodiments, the at least one laminating layer can at least be partially transparent. In some embodiments, the at least one laminating layer can be blackened, resulting in an at least partially transparent laminating layer. If the optoelectronic arrangement comprises more than one laminating layer, none, one, a selection of the laminating layers, or all laminating layers can be blackened.

In some embodiments, the at least one emitter element, in particular LED, and/or detector element can be smaller than 300 µm, in particular smaller than 150 µm. With these spatial extensions, at least one emitter element and/or detector element is almost invisible for the human eye.

In some embodiments, the at least one emitter element is a LED. A LED can in particular be referred to as a mini LED, which is a small LED, for example, with edge lengths of less than 200 µm, in particular down to less than 40 µm, in particular in the range from 200 µm to 10 µm. Another range is between 150 µm to 40 µm.

The LED also can be referred to as a micro LED, also called µLED, or a µLED-chip, in particular for the case of the edge lengths being in a range of 100 µm to 10 µm. In some embodiments, the LED can have spatial dimensions of 90×150 µm or the LED can have spatial dimensions of 75×125 µm.

The mini LED or µLED-chip can in some embodiments be an unpackaged semiconductor chip. Unpackaged can mean that the chip is without a housing around its semiconductor layers such as for example an unpacked semiconductor die. In some embodiments, unpackaged can mean that the chip is free of any organic material. Thus, the unpackaged device does not contain organic compounds, which contain carbon in covalent bonding.

In some embodiments, each emitter element can comprise a mini LED or a µLED-chip configured to emit light of a selected color. In some embodiments, each emitter element can comprises one or more mini LEDs, or µLED-chips, such as for example a RGB-Pixel, which comprises three mini LEDs or µLED-chips. A RGB-Pixel can for example emit light of the colors red, green and blue as well as any mixed color.

In some embodiments, an RGB-Pixel can further comprise one or more integrated circuits (IC), in particular small integrated circuits as for example micro integrated circuits (µSIC).

In some embodiments, the optoelectronic arrangement, laminate structure, or monitoring system comprises at least one conductor line and preferably two conductor lines, also referred to as conductor layers, particularly to supply electric energy and/or a data signal to the at least one emitter element and/or detector element.

In some embodiments, the carrier layer carries the at least one conductor line. However in some embodiments, at least one laminating layer can carry the at least one conductor line.

In some embodiments, the at least one conductor line can be of a conductive material, such as for example copper. The at least one conductor line can be coated and/or blackened to reduce the reflectance of the outer surface area of the at least one conductor line. The coating can for example be a palladium or molybdenum coating. In some embodiments, the at least one conductor line can have a width in the range between 5 μm to 50 μm.

In some embodiments, the at least one conductor line can be formed as a conductive mesh, particularly a metallic mesh. The mesh can be coated and/or blackened, in particular to reduce the reflectance of the outer surface area of the conductive mesh. The coating can for example be a palladium or molybdenum coating.

In some embodiments, an optoelectronic arrangement comprises a layer stack, which includes a carrier layer as well as a first cover and a second cover. The carrier layer is in particular an intermediate layer, which is arranged between the first cover layer and the second cover layer. At least one electronic or optoelectronic element, in particular an optoelectronic light source, is arranged on the carrier layer and at least one layer of the layer stack and preferably all layers of the layer stack are at least partially transparent. The layer stack comprises at least one electrically conductive layer, which is arranged between two adjacent layers of the layer stack or embedded in a layer.

In some embodiments, the at least one electrically conductive layer comprises at least one conductive line which is electrically connected to a contact pad of the optoelectronic light source. The at least one electrically conductive layer can be of a good electrically and thermally conductive material such as for example copper, silver, gold and aluminum. The at least one electrically conductive layer and particularly the at least one conductive line can be coated and/or blackened to reduce the reflectance of the outer surface area of the at least one conductive line. The coating can for example be a palladium or molybdenum coating. In some embodiments, the at least one electric line can have a width in the range between 5 μm to 50 μm.

The at least one electrically conductive layer can comprise an electrically conductive mesh, for example a metallic mesh, in particular a copper mesh. The mesh can have nodes and interconnects between the knots, wherein, preferably, at least the majority of the interconnects are not interrupted. The at least one electrically conductive layer can thus be structured and comprise a plurality of conductive lines being connected with each other.

The mesh can have a regular or an irregular pattern, wherein an irregular pattern can be preferred, as an irregular pattern can increase the transparency of the electrically conductive layer. The reason for this can be that an irregular pattern can be more difficult to perceive by the human eye.

In some embodiments, the conductive mesh is coated and/or blackened, in particular to reduce the reflectance of the outer surface area of the conductive mesh. The coating can for example be a palladium or molybdenum coating.

At least some embodiments the optoelectronic arrangement, laminate structure, or monitoring system as described herein can be arranged on non-flat or curved surfaces, for example on the outside or in the interior of a vehicle or a building. This is in particular possible as at least some embodiments of the optoelectronic arrangement, laminate structure, or monitoring system as described herein can be built on the basis of a layer structure which is flexible.

The invention therefore also relates to a larger entity, such as a vehicle or building, which comprises on its exterior or interior, in particular on an exterior or interior surface, at least one optoelectronic arrangement, laminate structure, or monitoring system.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

BRIEF DESCRIPTION OF THE DRAWINGS

The present invention will be described in more detail with reference to the following drawings, which schematically illustrate exemplary embodiments.

FIG. 10a and

FIG. 10b schematically represent the disposition of temperature sensors within a motor vehicle according to an embodiment of the present invention FIG. 11 schematically illustrates a section of substantially transparent laminate with temperature sensors according to a further embodiment of the present invention, FIG. 12 schematically illustrates a section of substantially transparent laminate with temperature sensors according to a further embodiment of the present invention, FIG. 13 schematically illustrates a section of substantially transparent laminate with temperature sensors according to a further embodiment of the present invention, FIG. 14 schematically illustrates a section of substantially transparent laminate with temperature sensors according to a further embodiment of the present invention, FIG. 15 schematically illustrates a section of substantially transparent laminate with temperature sensors according to a still further embodiment of the present invention,

FIG. 16a and

DETAILED DESCRIPTION

Figure 1:
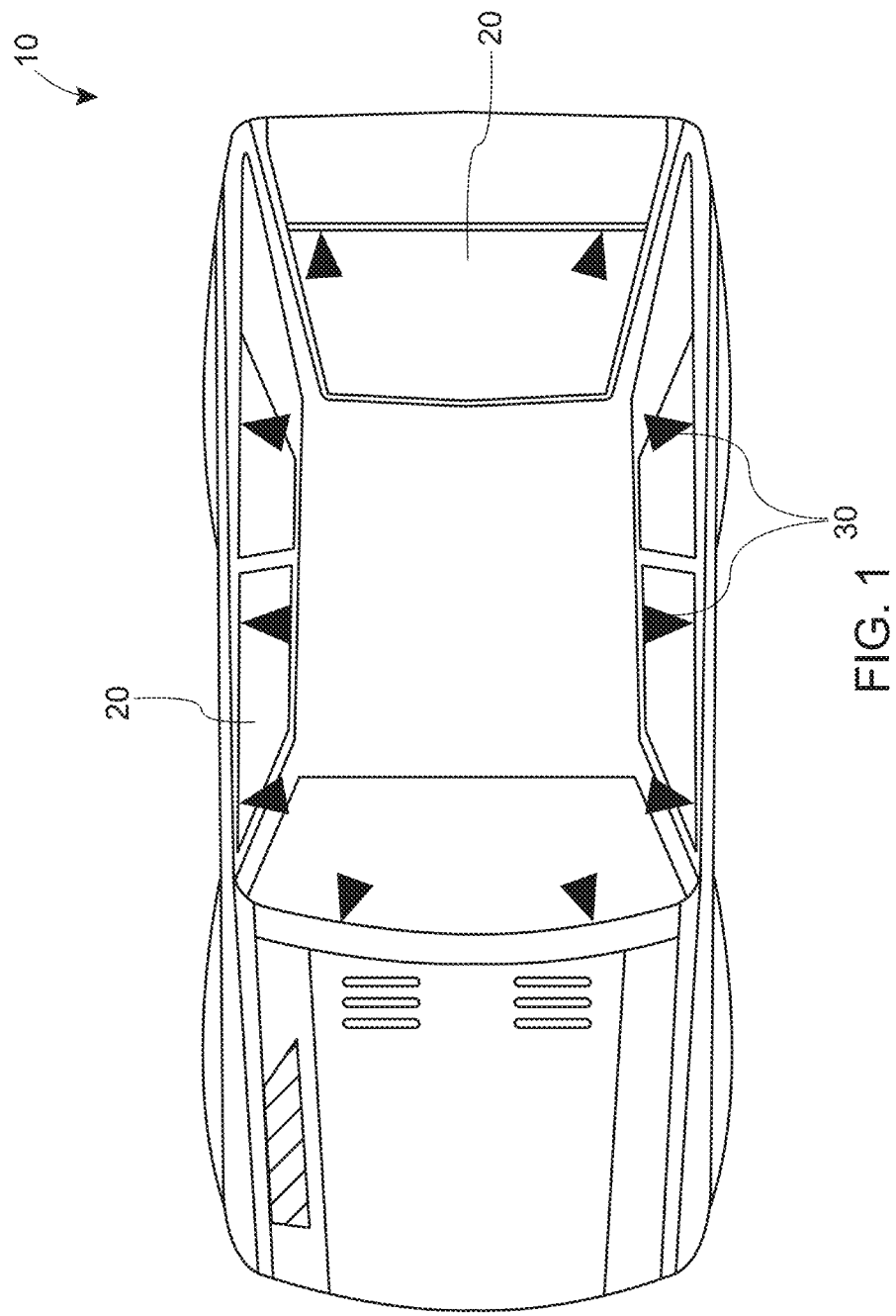
FIG. 1 is a schematic representation of the disposition of sensors within a motor vehicle according to an embodiment of the present invention, FIG. 2 schematically illustrates a detection field according to one embodiment of the present invention, FIG. 3 schematically illustrates a detection field according to a further embodiment of the invention, FIG. 4 schematically illustrates a detection field according to a still further embodiment of the invention, FIG. 5 schematically illustrates a section of substantially transparent laminate with 3D sensors according to a first embodiment of the present invention, FIG. 6 schematically illustrates a section of substantially transparent laminate with 3D sensors according to a further embodiment of the present invention, FIG. 7 schematically illustrates a section of substantially transparent laminate with 3D sensors according to a still further embodiment of the present invention, FIG. 8 schematically illustrates the structures of emitter and receiver elements in accordance with the present invention, FIG. 9 schematically illustrates a section of substantially transparent laminate with temperature sensors according to an embodiment of the present invention.

FIG. 1 schematically illustrates a plane view of a motor vehicle 10. In the exemplary embodiments shown here, the motor vehicle is a car, but the present invention is applicable to any motor vehicles comprising glazed windows, including, but not limited to, buses, vans and trucks. The motor vehicle 10 is equipped in the conventional manner with front, rear and side windows surrounding the internal space of the car. The vehicle may further include a glazed roof panel (not illustrated). The windows are made of a substantially transparent laminate structure 20 as will be described in more detail below. The laminate structure 20 of each window furthermore comprises one or more sensors 30 forming part of a 3D sensor system, in particular a monitoring system. In the embodiment shown, the sensors 30 are directed towards the interior of the motor vehicle as indicated by the triangles depicting the conical field of view of each sensor.

The sensors 30 comprise photoelectric emitter 301 and detector elements 302 distributed over the surface of the laminate structure 30 and controlled to operate in cooperation to detect objects and/or movement within the monitored space. In the illustrated examples one sensor 30 may represent one or more photoelectric emitters 301, one or more photoelectric detectors 302 or a combination of one or more emitters and detectors. As a consequence, each sensor 30 may represent a single pixel or an array of pixels. The photoelectric detector elements 302 may be controlled to detect reflected or transmitted light. In the context of the present disclosure, the term light refers to any wavelengths between about 240 nm to about 900 nm and thus encompass ultraviolet light, through the visible spectrum to infrared light. The photoelectric emitter 301 and detector elements 302 may thus operate at suitable wavelengths within this range.

Examples of emitter elements 301 include LEDs such as IREDs, or lasers such as VCSELs (Vertical Cavity Surface Emitting Laser) configured to emit spots or lines of light. The detector elements 302 may include one or an array of photodiodes, photodetectors, image sensors such as CCD or CMOS sensors, ToF cameras or the like. The emitter and detector elements 301, 302 comprised in the sensor system are configured and controlled to detect objects in 3-dimensions. This may be achieved using the principle of triangulation or structured light. Alternatively, the detector elements 302 may comprise a ToF (Time of Flight) sensor or array capable of providing both 2D image information and depth information in cooperation with a controlled emitter element, either by measurement of phase shift between emitted light signal and received signal or of the time difference between an emitted pulse of light and a received signal. Preferably, the emitter and detector elements 301, 302 operate in non-visible light, such as infrared, to minimise disturbance to the motor vehicle occupants and to alleviate interference from ambient lighting.

Figure 2:
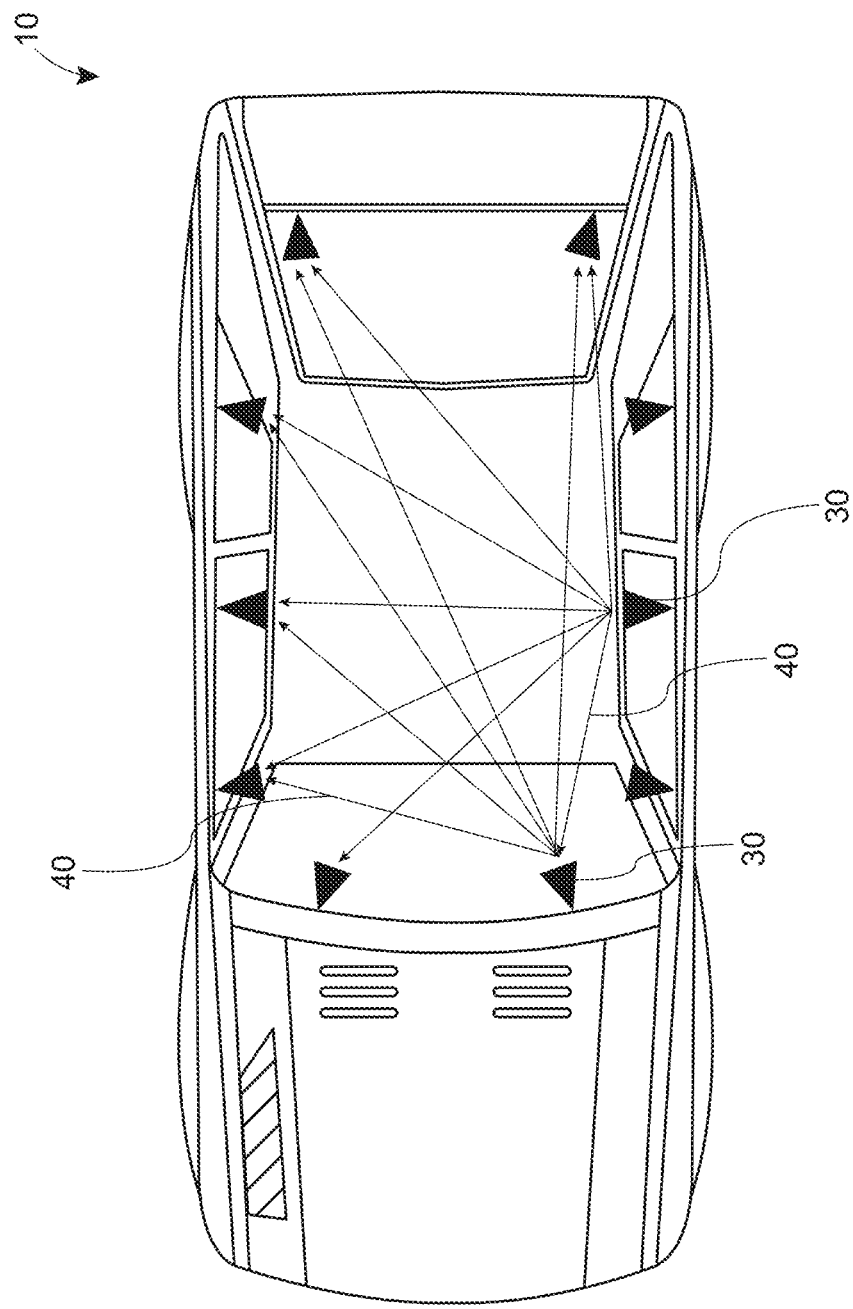

FIG. 2 schematically illustrates an arrangement of sensors 30 at different locations in the windows of the motor vehicle to provide detection paths that intersect the whole space. Each photoelectric emitter 301 and detector 302 may be arranged to emit and detect light in a specific direction or direction cone. In the figure, only two sensors 30 are shown emitting light. These sensors 30 are arranged on a side and the front window, respectively, of the motor vehicle. The light transmitted by these sensors 30 is detected by detector elements 302 of the remaining sensors 30 arranged on windows lying opposite and adjacent the originating window as indicated by the light path 40. The judicious placement of sensors 30 allows these light paths to substantially cover the space inside the vehicle resulting in a three-dimensional detection zone.

Figure 3:
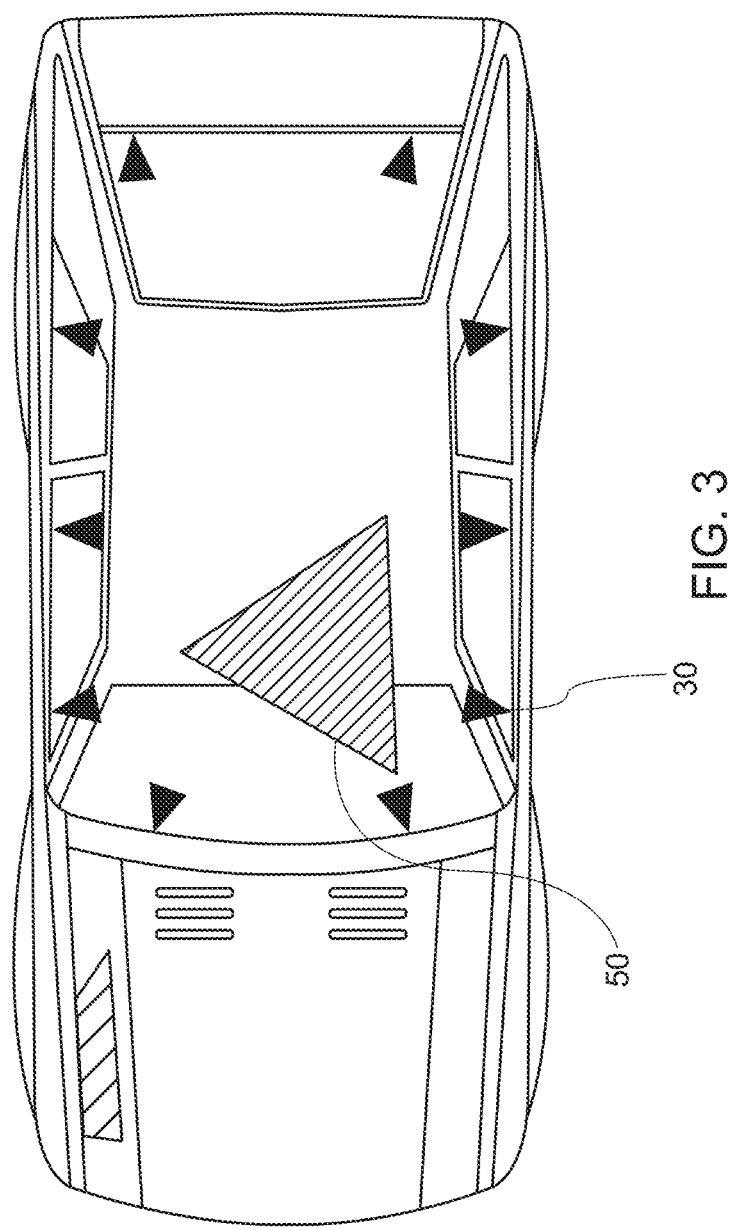

FIG. 3 schematically illustrates an exemplary embodiment of a sensor arrangement comprising ToF detector elements 302 working in conjunction with VCSEL emitter elements 301 for monitoring the interior of the motor vehicle. In this embodiment, sensors 30 generate 3-dimensional data on objects within a designated area, preferably a substantially conical detection zone. This is illustrated by the shaded area 50. Overlapping detection zones 50 enable the complete monitoring of the interior space.

Figure 4:
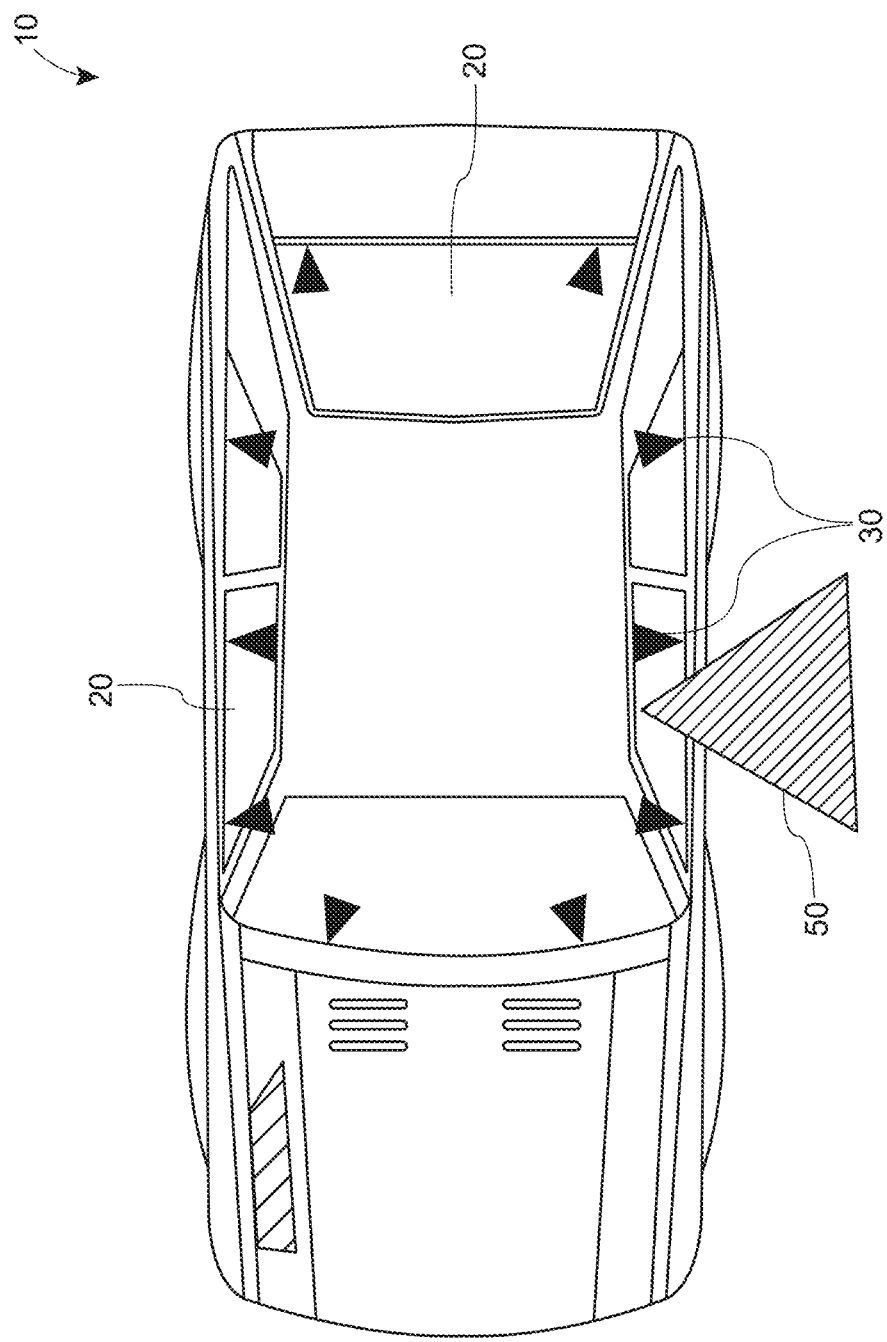

FIG. 4 shows a further embodiment of the sensor system using one or more ToF sensors 30 comprised in the driver's side window and directed outwards, thus generating an external 3D detection zone 60. This application may be used for driver recognition to enable automatic unlocking the motor vehicle. The skilled reader will understand that the ToF sensor 30 can be replaced by a 3D sensor 30 using triangulation or structured light, for example.

In the illustrated embodiments, sensors 30 are depicted lying in substantially the same horizontal plane relative to the vehicle interior. However, it will be understood by those skilled in the art that sensors 30, or at least emitter and/or detector elements 301, 302 may be located in different horizontal planes in order to ensure complete or more targeted monitoring of the space. In addition to the side, front and rear windows, it is possible to provide the described sensor system in a glazed roof panel. It is further possible for different sensor types to be incorporated in the same motor vehicle or even the same laminate structure 20 making up a window. In this way, ToF sensors disposed on the front windshield or driver's side window may be used for driver recognition inside a motor vehicle and possibly outside the driver's door, while LEDs and photodetectors disposed on the same and other windows may be used to monitor passenger positions using triangulation, structured light or other mapping techniques.

Figure 5:
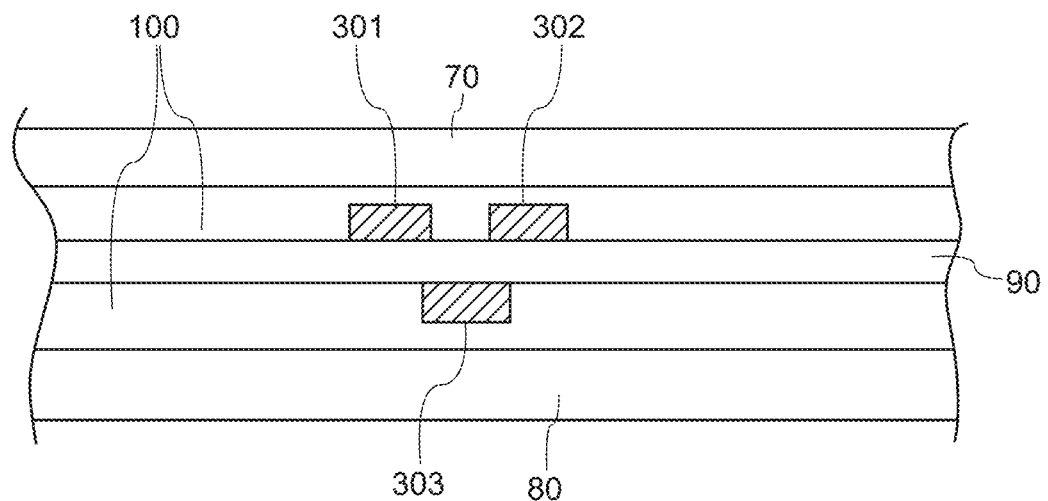
Figure 6:
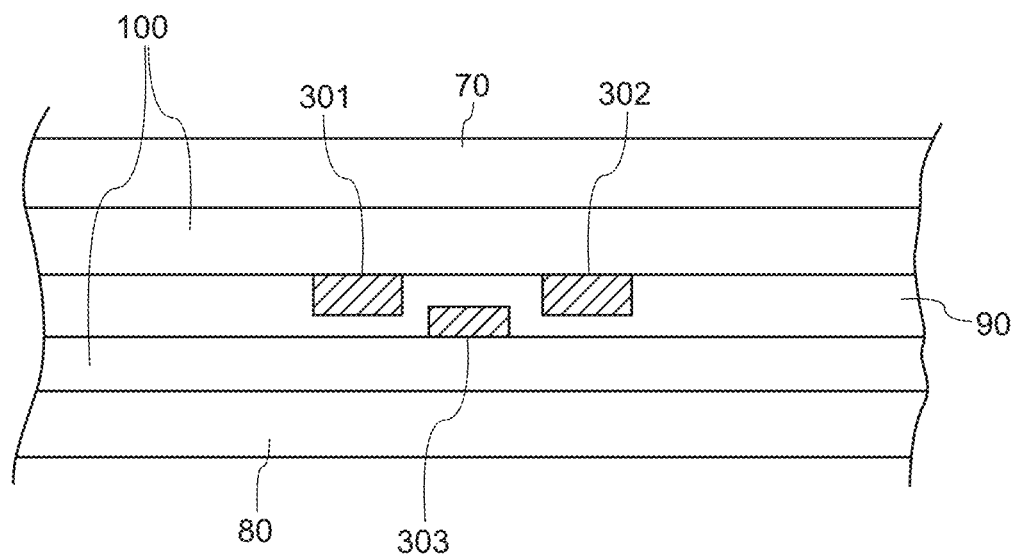
Figure 7:
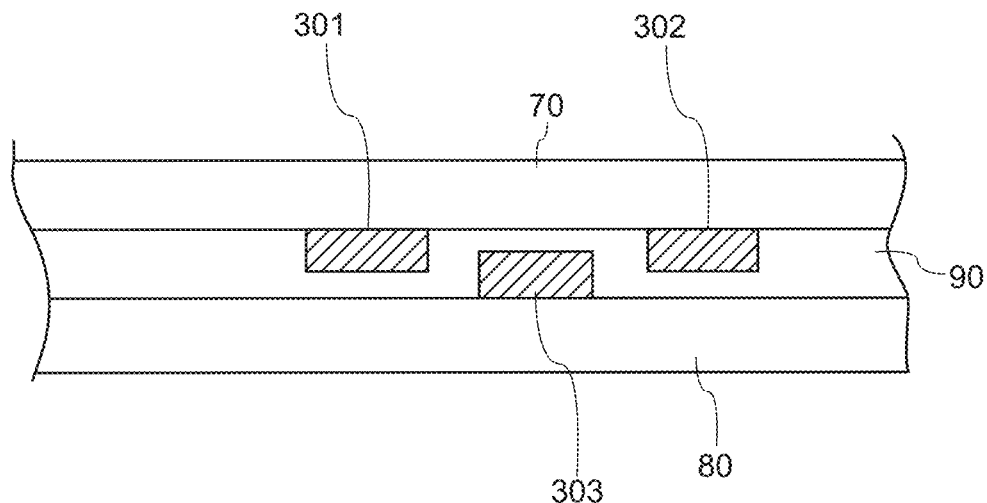

Turning now to FIGS. 5, 6 and 7 there are schematically illustrated different embodiments of a section of a transparent laminate structure 20 for use as a motor vehicle window or roof section in which the 3D sensor of the present invention is incorporated. In these figures, like numerals designate like structures. The figures are provided for illustrative purposes only and the relative dimensions shown are not representative of the real structure.

In FIG. 5 the transparent laminate structure 20 is composed of front and rear layers 70, 80 of substantially transparent material, such as glass or a polycarbonate or acrylic (PMMA) plastic. Between these two layers 70, 80 is interposed an intermediate carrier layer or film 90 which is bonded to the front and rear layers 70, 90, respectively, by bonding layers 100. The bonding layers 100 are also substantially transparent with inherent adhesive properties, and may, for example be composed of a thermoplastic. In the illustrated embodiment only one front and one rear layer 70, 80 are illustrated, however, these layers may be composed of further layers or films, for example for UV protection or the like. The carrier layer or film 90 is of a preferably flexible, substantially transparent material, such as a thermoplastic. On one or both sides it is provided with wiring (not shown) with connecting channels or vias as necessary to provide contacts to the various components.

In the illustrated example, an emitter and receiver element 301, 302, are disposed on the carrier layer 90 and electrically connected to the wiring. Disposed on the opposite side of the carrier layer 90 and likewise electrically connected to the wiring on that layer and to the emitter and receiver elements 301, 302 is image processing and control circuitry 303 for controlling the operation of the emitter and detector elements 301, 302 and processing the received signals. The components 301, 302, 303 may be bonded to the carrier layer 90 directly or alternatively bonded or soldered to contacts in the wiring, which in turn is bonded to the carrier layer 90.

The wiring on the carrier layer 90 serves to supply power to the elements 301, 302, 303. In some applications is may be possible to make use of wiring already present in a window laminate structure, such as that provided for window heating. The wiring also enables communication both between the sensor elements 301, 302, 303 and preferably also between the image processing and control circuitry 303 and further processing and control circuitry not present on the carrier layer. This further circuitry may be used for image processing and thus reduce the processing power required for the image processing and control circuitry 303. In addition, or alternatively, this additional processing circuitry may include control units for unlocking the car in response to driver recognition, for enabling start in response to driver recognition or deploying airbags in response to the detected passenger positions, for example.

The wiring and the components 301, 302, 303 present on the carrier layer 90 are preferably dimensioned so as to be virtually imperceptible to the occupants of the motor vehicle so that the laminate structure 30 is substantially transparent. To that end, all dimensions of components 301, 302, 303 and the wiring width is preferably smaller than 500 µm, and still more preferably smaller than 200 µm. In this way, it is possible for the emitter and receiver elements 301, 302 and associated processing and control circuitry 303 to be distributed in a two-dimensional layout over the carrier layer and thus over the laminate structure 30 forming the windows and/or roof of the motor vehicle without impacting substantially on the transparency of the windows or glazing panels.

In the embodiment illustrated in FIG. 5, the emitter and receiver elements 301, 302 and the processing and control circuitry 303 are embedded in the bonding layer 100. This may be achieved by locally heating the bonding layer around these components to liquefy it prior to attaching the front and rear layers 70, 80.

In the example embodiments illustrated here, an emitter element 301 is grouped with a receiver element 302 and processing and control circuitry 303. It will be appreciated by one skilled in the art, however, that this arrangement is simply for illustration and that emitter and receiver elements 301, 302 need not be arranged in pairs and furthermore that processing and control circuitry 303 may be associated with a plurality of emitter 301 and/or receiver elements 302. As discussed above, each emitter and/or receiver element 301, 302 may represent single pixels or an array of pixels. It is further possible that emitter and receiver elements 301, 302 be packaged together as a single unit.

During manufacture of the laminate structure 20, the sensors, 30, i.e. the emitter and receiver elements 301, 302 and image process and control circuitry 303 are mounted on the carrier layer 90, that is already provided with wiring, and the front and rear layers 70, 80 bonded to this subsequently. It is further possible that the carrier layer 90 be provided with wiring and components in the desired arrangement and then cut or stamped to appropriate dimensions prior to assembling the laminate structure 30.

FIG. 6 shows an alternative arrangement of the laminate structure 30. This arrangement differs from that of FIG. 5 in that the photoelectric emitter and receiver components 301, 302, and the image processing and control circuitry 303 are embedded in the carrier layer 90, such that the front surfaces of the emitter and receiver elements 301, 302 are essentially flush or on a level with the front surface of the carrier layer 90. The processing and control circuitry 303 may be arranged as illustrated, i.e. flush with a rear surface of the carrier layer 90, or alternatively on a level with the front surface of this layer 90.

FIG. 7 shows a still further arrangement of the laminate structure 30. In this arrangement also, the photoelectrical components 301, 302, 303 are embedded in the carrier layer 90. However, no additional bonding layer is provided. Instead, the front and rear layers 70, 80 of the laminate structure to be mounted directly on the carrier layer 90, with the carrier layer acting as the bonding material.

Figure 8:
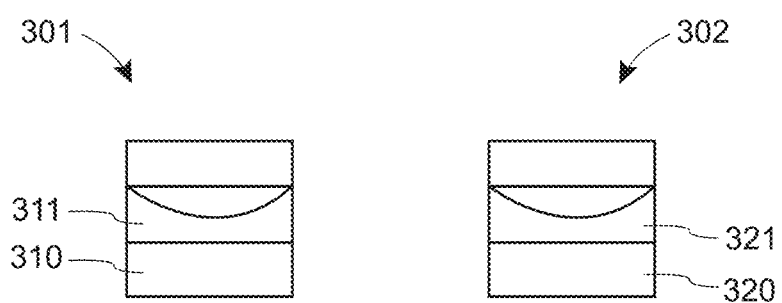

Turning to FIG. 8 the structure of emitter and receiver elements 301, 302 are illustrated in more detail. The photoelectric emitter element 301 comprises a semiconductor body 310 of conventional construction according to the type of device (µLED, IRED, VCSEL or the like) and a lens 311. Similarly, the detecting element 302 comprises a semiconductor body 320 and a lens 321. The lenses 311, 321 may be standard optical lenses. Alternatively, they may formed as a Fresnel lens or be composed of diffracting optical elements. The lenses 311, 321 serve to limit the emission field and field of view, respectively, of the underlying devices 310, 320 and thus enables the required light paths and detection zones to be configured more accurately. Preferably, the lens 311 limits emission to an angle of ±45° from normal. The lens 321 of the photoelectric detector element may restrict received light to a similar angle.

Figure 9:
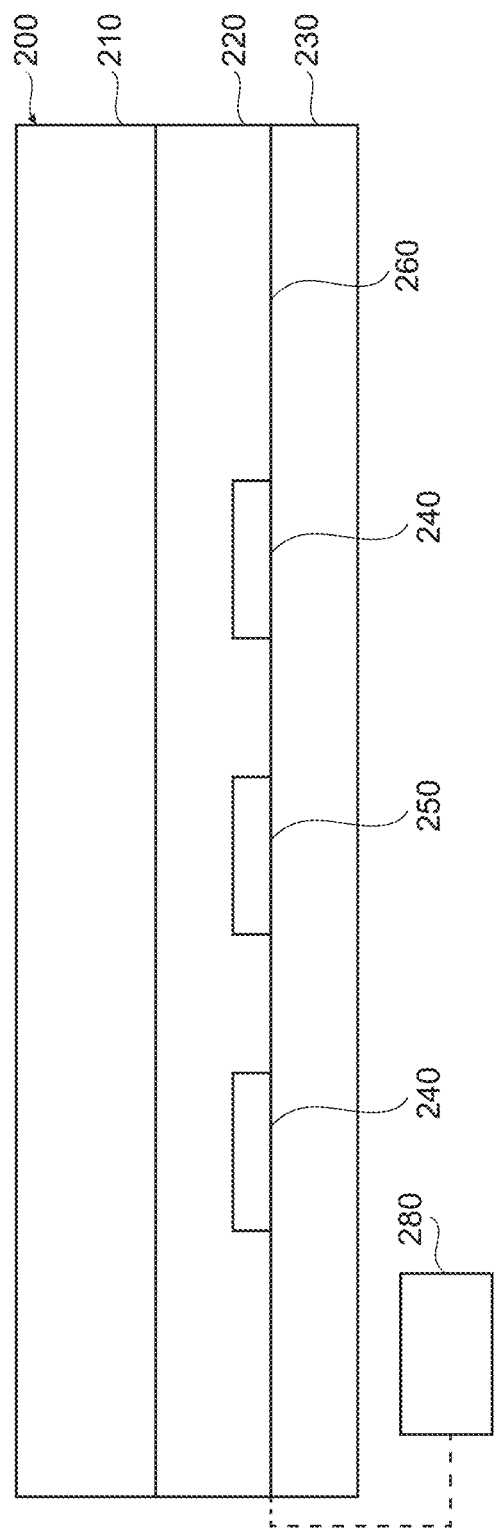

FIG. 9 illustrates an embodiment of an optoelectronic arrangement according to another aspect of the present invention. Illustrated in FIG. 9 is a further laminate structure 200 comprising at least multiple LEDs 240 but in which temperature can be measured in a localized fashion. This laminate structure 200 may be used for the glazing of a building or vehicle, and hence form one or more windows or a roof panel of a vehicle. It may also be used as a partially glazed covering for other surfaces, such as a wall of a building or a dashboard of a vehicle. The illustrated laminate structure 200 is preferably substantially transparent, but may be coloured or tinted to filter light to a greater or lesser extent.

The laminate structure 200 has a cover layer 210, which is substantially transparent and made of any suitable glazing material, such as glass, or a polycarbonate or acrylic (PMMA) plastic. This outer layer 210 may be coloured or tinted. In this arrangement, the cover layer 210 forms the front of the laminate structure for the purposes of display. On the opposite surface of the laminate structure 200 is a carrier layer or film 230 on which are mounted optoelectronic elements which include LEDs 240 and may include further components dedicated for determining the temperature 250. The carrier layer 230 may be flexible and is preferably substantially transparent. The carrier layer is preferably made of thermoplastic material, for example PET or the like. It is further provided with electrical connections or contacts forming a structured conductor layer 260 for supplying power to the optoelectronic components 240, 250 and to which the optoelectronic elements 240, 250 are bonded. The conductor layer 260 may be made of metal, such as silver or gold, or of a substantially transparent conductive material, such as a conductive oxide, e.g. Indium Tin Oxide, or ITO. In particular when made of an opaque material, the conductor paths may have a width that is sufficiently small to render them virtually imperceptible to the human eye at a distance of 0.5 m. In general, the conductor path widths should be ≤300 nm.

The carrier layer 230 may be made of a thermoplastic or other suitable flexible material that allows the carrier layer to conform to the shape of the outer layers. In other words, the shape of the laminate structure 200, be it substantially planar or curved, can be defined primarily by the outer layer 210 or layers. Other non-shown layers may be present in the laminate structure 210.

The optoelectronic components include one or more light emitting elements 240, which may be LEDs in packages that may comprise one or several semiconductor chips. In addition, there may be one or more temperature sensors 250, which may be thermistors (NTC or PTC), platinum resistance thermometers, or the like. A further lamination layer 220 encapsulates the optoelectronic elements 240, 250 and bonds the outer layers together.

Both the LEDs 240 and temperature sensor 250 allow the determination of local temperature, that is, the temperature in the immediate vicinity of the component itself. The temperature sensor 250 provides a temperature dependent signal according to the particular technology employed. The LEDs 240 also allow determination of temperature, for example, by measuring the LED forward voltage Vf, which decreases with increase in temperature. Local temperature changes may also be determined by monitoring the conductivity of the conductor layer 260, which also varies with temperature. The monitoring of the LED forward voltage is preferably performed by an LED drive or control circuit 280 that controls the operation of the LED 240. This control circuit 280 may also monitor the conductivity of conductor paths in the conductor layer 260 close to one or a group of LEDs 240. The control circuit 280 may also be coupled to the temperature sensors 250, if present. Alternatively, a separate circuit for monitoring and/or controlling the temperature sensors may be provided. The control circuit 280 may be external to the laminate structure and connected via the contacts. Alternatively, control circuit 280 may be mounted on the carrier layer 230 with the optoelectronic elements 240, 250 (not shown). In the case of the latter arrangement it is preferably that the control circuit 280 is kept small and consequently configured to control fewer LED chips, or even a single LED chip, i.e. a single pixel. In this way, the determination of the forward voltage Vf to determine changes in temperature may be performed per LED chip. The same level of resolution is achievable when measuring conductivity of the conductor layer 260. For example, conductivity of conductor paths in the conductor layer 260 may be measured between groups of LEDs 240 or LED chips to obtain a smaller resolution of local temperature. When dedicated temperature sensors 250 are used, the temperature resolution obtained depends on the distance between the temperature sensor 250 and the LED 240 or group of LEDs monitored and also on the area covered by the group of LEDs monitored. To ensure optimal operating conditions, it is preferably that the temperature sensors are located as close as possible to the LED chip or chips determining temperature. The distance between a temperature sensor 250 and the LED 240 or group of LEDs for which the temperature is to be determined is thus no more than 5 cm, preferably no more than 1cm and still preferably no more than 0.5 cm. The processing circuitry for processing the temperature signals from the temperature sensor 250, the LEDs 240 and/or for determining the conductivity of the conductor layer 260 may be arranged externally to the laminate structure 210 or be contained in the laminate structure 200, for example mounted on the carrier layer 230 and electrically coupled to the conductive layer 260.

Preferably, the optoelectronic components 240, 250, and any associated drive circuitry and processing circuitry mounted within the laminate structure have edge dimensions of no more than 300 µm. As stated earlier, at a distance of 0.5 m, the human eye no longer perceives objects having dimensions of ≤300 µm. The laminate structure is thus essentially transparent to the human eye unless the LEDs 240 are illuminated.

In some embodiments, a micro LED, also called µLED, or a µLED-chip can be used as optoelectronic component. A µLED is a small LED, for example, with edge lengths of less than 70 µm, in particular down to less than 20 µm, in particular in the range from 1 µm to 10 µm. Another range is between 10-60 µm. This can result in a surface area from a few hundred µm$^2$ to a few tens of µm$^2$. For example, a µ-LED can have a surface area of approximately 2500 µm$^2$ with an edge length of approximately 50 µm. In some cases, a µ-LED has an edge length of 5 µm or less, which results in a surface area size of less than 30 µm$^2$. Typical heights of such µ-LEDs are, for example, in the range of 1.5 µm to 10 µm.

A micro light emitting diode chip, also called µLED-chip, can be used as optoelectronic component. A micro light emitting diode can form a pixel or a subpixel and emit light of a selected colour.

When used as a means of measuring temperature, the LEDs 240 preferably provide other functions at the same time, for example, as a means for displaying information, for lighting, or as an emitter in an emitter/detector proximity sensor.

When operated at constant current, the lumen output of LEDs 240 varies as a function of the junction temperature. The colour output by LEDs typically also varies with temperature. This temperature dependence is also a function of the semiconductor material used. For example AlInGaP LEDs typically used for red and amber light vary more with temperature than InGaN LEDs that are used for blue, green and cyan. In an RGB LED arrangement or similar combined colour arrangement the balance of colour will thus also change with temperature. The lifespan of LEDs and other optoelectrical components is also reduced when these are operated outside their rated temperatures. For LEDs used in vehicle glazing or buildings, the danger is typically high temperatures due to the heating effect of sunlight impacting the windows and heating the interior.

The effect of increasing local temperature can be mitigated according to the present invention by adjusting the operating parameters, i.e. by reducing the power dissipation of the LEDs affected, for example by altering the current throughput under control of the control circuit 280. Similarly, a determined drop in temperature may trigger the reduction in power to the LEDs by the control circuit 280. In some embodiments, the temperature of all LEDs can be determined at vehicle start and optionally periodically and the LED operation calibrated or adjusted to optimise the operation and/or lifespan. In some embodiments, excessive localised temperature changes can generate an alert to trigger adjustment of operational parameters for the affected LEDs in order to mitigate the effects of the temperature change.

In some embodiments, the determined temperature can be used to adjust the operating parameters, e.g. current and/or voltages, of other optoelectronic or electronic components comprised in the laminate structure. Relevant components include photodetectors, such as photodiodes, CCD or CMOS cameras, TOF cameras, lasers and others.

In the arrangement illustrated in FIG. 9, the temperature measured by the temperature sensing optoelectronic elements 240, 250 indicates the temperature of the laminate structure 200 and is thus influenced by the temperature on both sides of this structure.

In some embodiments of the invention, a thermally insulating layer can be positioned on the lower surface of the structure illustrated in FIG. 1, namely adjacent the carrier layer 230. Temperature measurements by the optoelectronic elements 240, 250 can thereby be restricted to the opposite side of the laminate structure 200.

In some embodiments, the localised temperature determination can be used to adjust the air conditioning and/or heating in a localised manner, for example with one window 20 or glazed area representing local temperature resolution. In this case, the temperature readings from each monitored area can be relayed or signalled by the control circuit 280 to a separate climate control controller in the car, or building.

Turning now to FIGS. 10a and 10b there is shown one example of an arrangement of the laminate structure used in a vehicle in side and plane views, respectively. The vehicle is a car 10, however, the laminate structure 200 may equally be used in any vehicle having glazing, including mirrors or having other surfaces on which a laminate structure may be applied, such as elements of the dashboard, for example. The illustrated vehicle 10 has a front and rear windshield and side windows all of which are constituted at least in part by a laminate structure 200 as described herein. In some embodiments, the laminate structure 200 may be used on only some of the glazed windows of a vehicle 10. Optoelectronic components including LED 240s, and possibly also a dedicated temperature sensor 250, are distributed over the surface of the glazed windows. Each optoelectronic component may provide information on the local temperature. As discussed above, in some cases the localised temperature around the optoelectronic components may be determined by measuring changings in conductivity of the conductor layer 260.

In the car 10 shown in FIG. 10, four temperature locations may be defined based on the front and rear windshields and the four side windows 20. It is furthermore possible to monitor and control temperature differently based on the front and rear side windows 20. In this way, the vehicle interior can be maintained at an essentially uniform temperature regardless of different external conditions, such as sunshine or wind direction.

Turning now to FIG. 11 there is shown a further embodiment of the laminated structure 200 in which LEDs 240 are arranged to provide light on both sides of the structure. As in the arrangement of FIG. 9, LEDs 240 and a temperature sensor 250 are arranged on a carrier layer 230 in electrical contact with a conductor layer 260 deposited on the carrier layer 230. However, in this arrangement the carrier layer is essentially double-sided with a further conductor layer 260 on its opposing side. LEDs 240 and a temperature sensor 250 are shown mounted to the underside of the carrier layer in electrical contact with a second conductor layer 260. The conductor layers 260 may be distinct or connected, for example by vias through the carrier layer. On each side of the carrier layer 230, a cover layer 210 is bonded by means of a bonding layer 220 in the same manner as described with reference to FIG. 9. As for previous embodiments, additional intermediate or even external layers may be present in the structure 200. In this and subsequent embodiments of the laminate structure 200, the control circuit 280 is omitted for reasons of clarity, but it will be understood that one or more control circuits 280 will be provided either as part of the laminate structure 200 or connected to this. In the arrangement of FIG. 11, the temperature of each LED chip or group of LED chips may be determined by monitoring the forward voltage to the LED or LEDs, by determining the conductivity of contacts on the conductive layer 260 or using dedicated temperature sensors 250, such as NTCs. In a similar fashion to the arrangement shown in FIG. 9, a flexible, substantially transparent carrier layer 260 is provided with a structured conductor layer 260 onto which the LEDs 240 and optionally one or more temperature sensors 250 are mounted. However, in the arrangement of FIG. 11, a conductor layer 260 is provided on both sides of the carrier layer and optoelectronic components are bonded to this conductive layer 260 on the underside of the carrier layer also. The optoelectronic components 240, 250 on both sides of the carrier layer 260 are encapsulated in a laminating layer 220 in the same manner as the arrangement shown in FIG. 9. Two outer substantially transparent layers 210 form the outer surfaces of the laminate structure. As for the arrangement of FIG. 9, these outer layers are made of any suitable glazing material, such as glass, or a polycarbonate or acrylic (PMMA) plastic and one or both outer layers 210 may be coloured or tinted. The laminate structure 200 may include other non-shown layers. The carrier layer 230 is thermally insulating such that the optoelectronic components 240, 250 on one side are at least partially independent of temperature variations on the other side.

Figure 12:
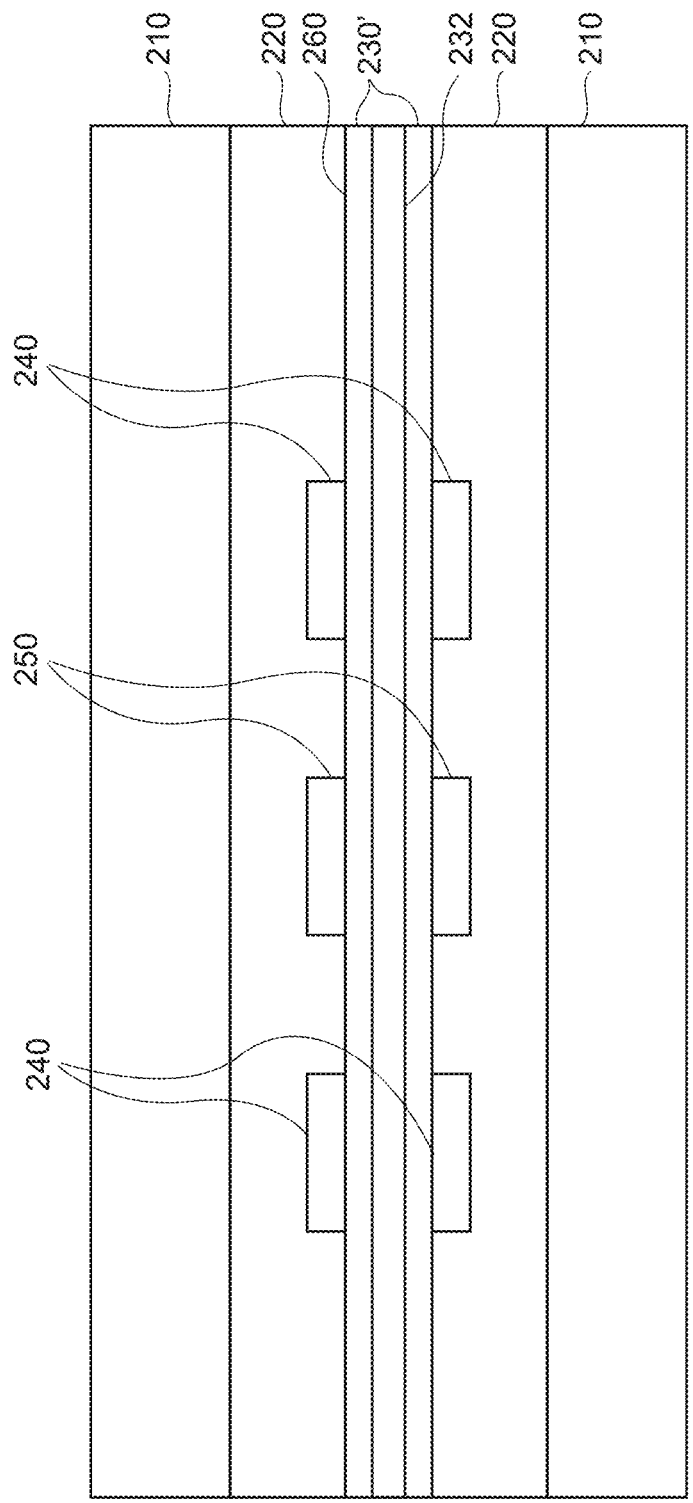

FIG. 12 shows a further variation of the double-sided laminate structure of FIG. 11 in which temperature can be measured and adjusted for independently on either side. In this arrangement, the carrier layer is composed of two carrier layer parts 230' separated by a thermally insulating layer 232 sandwiched between them. Each carrier layer part 230' is provided with a conductor layer 260 to provide a double-sided carrier layer structure to which the optoelectronic elements can be connected. The thermally insulating layer 232 is preferably of a material that reflects and/or blocks the transmission of IR radiation to reduce the localised heating of the laminated structure 200.

Figure 13:
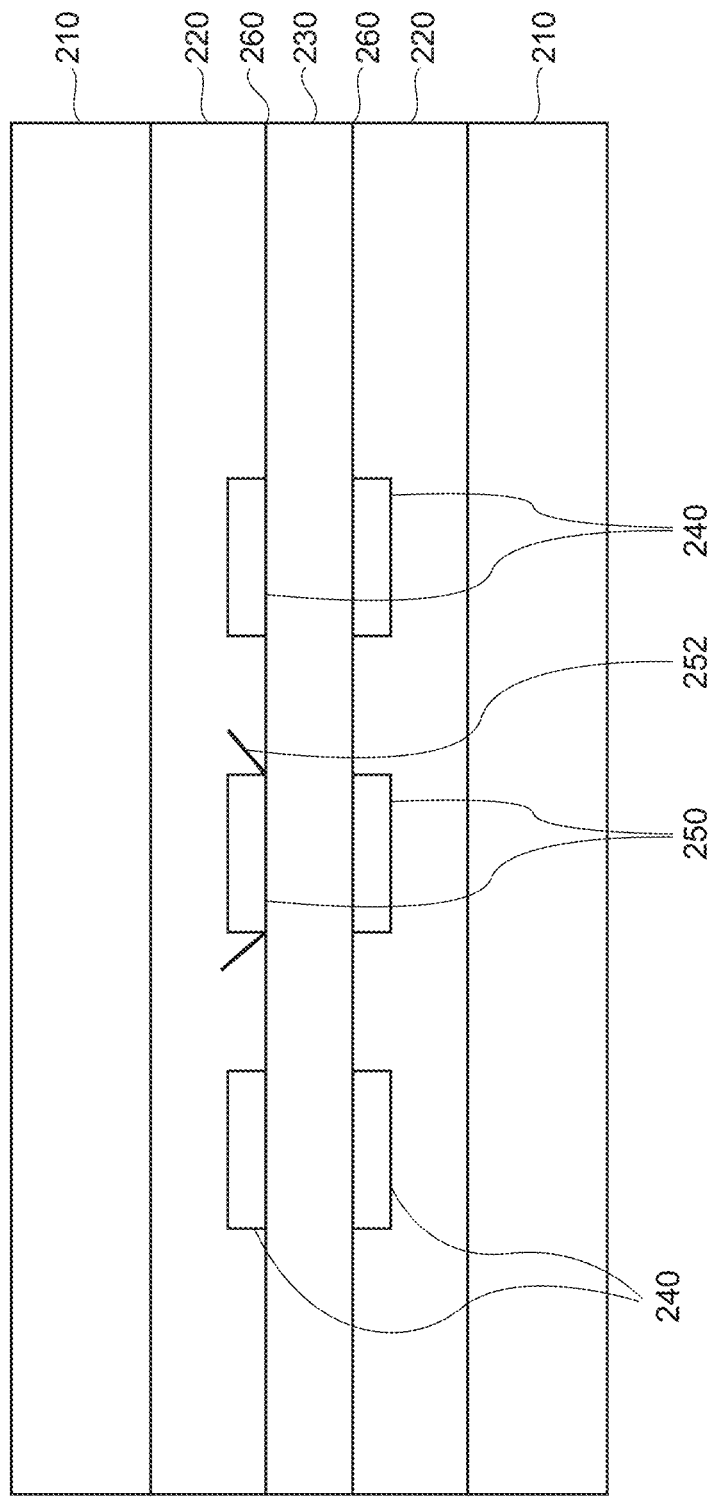

FIG. 13 shows another variation of a double-sided laminate structure configured to provided separate temperature determination on each side, and hence allow separate inside and outside temperature determination in a vehicle or a building, for example. This arrangement is similar to that illustrated in FIG. 11 and like reference numerals have been provided for like elements and will not be described further here. This structure differs over that shown in FIG. 11 by a directional reflector 252 formed on the underside and around the four lateral walls of a temperature sensor 250 to reflect light and infrared radiation away from the underside of the laminate structure and hence away from the underlying temperature sensors. The reflector 252 is preferably a reflective structure formed on the carrier layer 230 or conductor layer 260 and embedded in the laminating layer. The reflective structure 252 may comprise a mirror, a metal coating and or a dielectric coating, such as a distributed Bragg reflector. Preferably, the reflector 252 configured to reflect light and infrared radiation back towards and exterior surface of the laminate structure, i.e. on the outer surface of a vehicle window or building. This arrangement is particularly effective when temperature differences are caused by sunlight shining on a window or other glazed structure from the outside.

Figure 14:
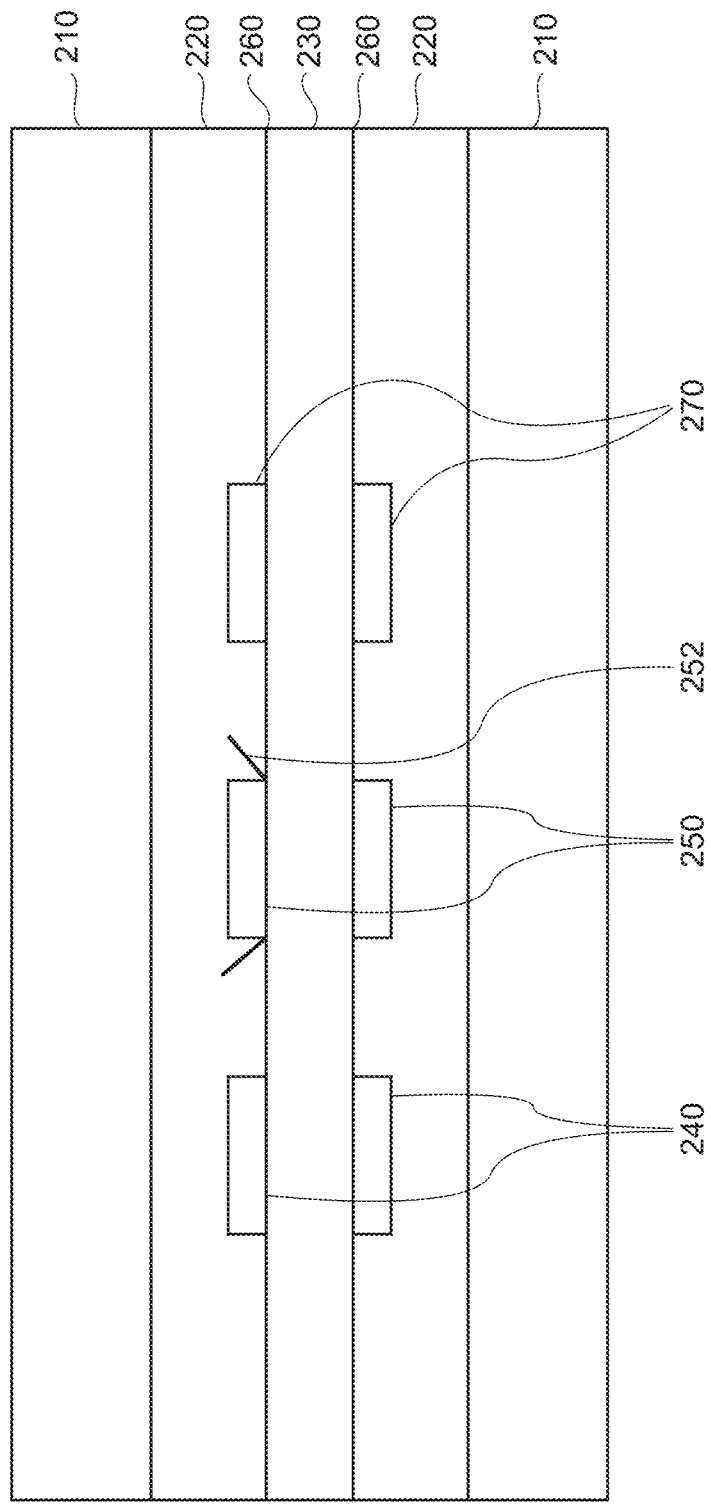

A further variant of the double-sided laminate structure is shown in FIG. 14. This arrangement has a similar laminate structure to that shown in FIG. 13. However, in this arrangement a further optoelectronic element in the form of a photodetector 270 is mounted on the carrier layer and electrically coupled to the conductor layer 230. The photodetector 270 is preferably located near the LED and optionally also a temperature sensor. In the illustrated arrangement, a photodetector 270 is mounted on both sides of the carrier layer 230, however, the laminate structure 200 may comprise one or more photodetectors 270 only on one side. The photodetector may be a photodiode or the like and is preferably suitable for detecting visible or white light in order to detect levels of sunlight shining on the laminate structure. Light intensity signals from the photodetector 270 are received and processed by the control circuit 280 (see FIG. 9) or other circuit module in communication with the control circuit 280. The temperature of the optoelectronic components 240 250 in the laminate structure 200 will necessarily be affected by the length and intensity of sunlight impacting the structure. The photodetector 270 thus allows the effect of sunlight to be taken into account. In some embodiments, it may be possible to adjust take account of temperature variations using only measurements from one or more photodetectors.

Figure 15:
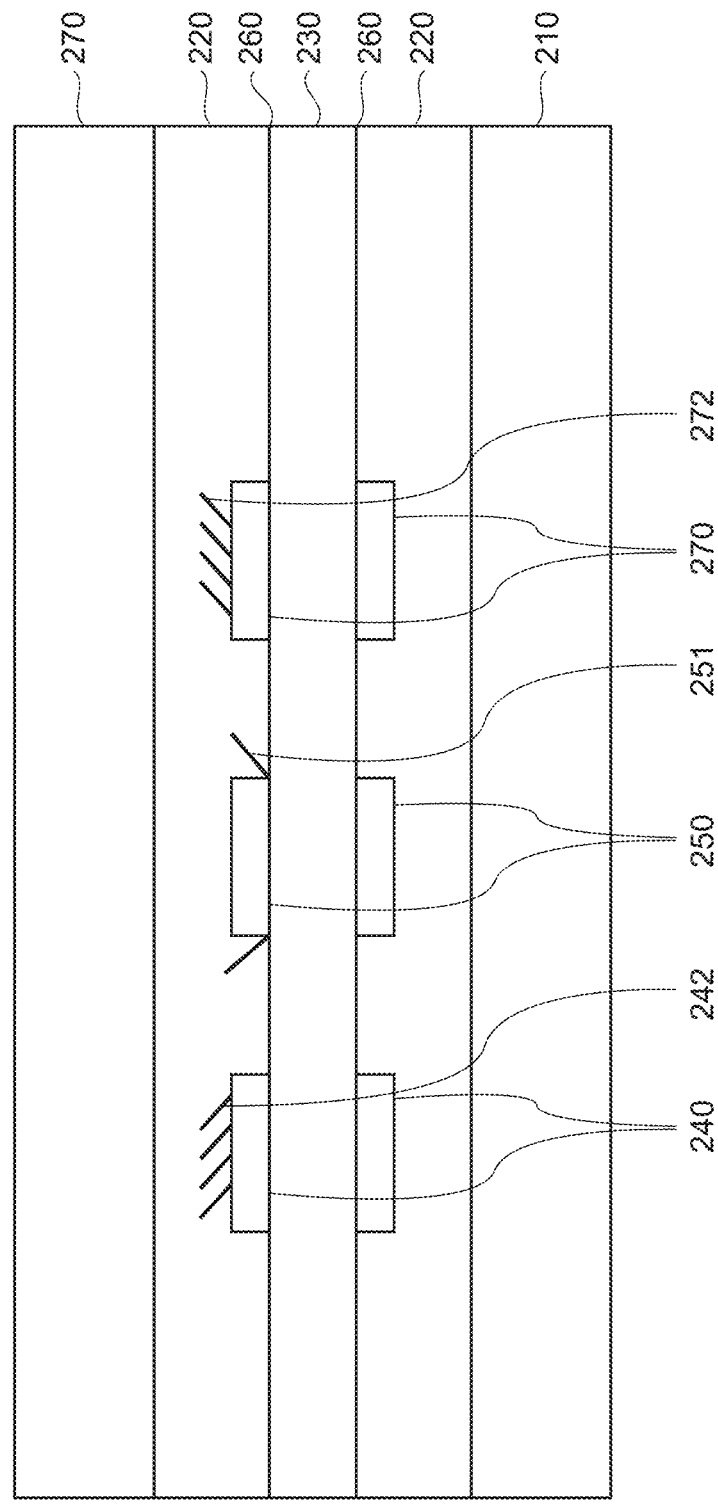

The photodetector 270 may further be combined with a directional structure 272 formed around the upper surface of the photodiode and embedded in the laminating layer 220. This variant of the laminate structure is illustrated in FIG. 15. The directional structure 272 is configured to collect light in specific directional parts or propagation channels according to the direction from which light is received. It may be formed of material having a higher refractive index than the surrounding material. Preferably the difference in refractive index should be greater than 0.02. Light incident perpendicularly on the laminate structure will be collected by all parts of the directional structure 272, while light incident at a greater or lesser angle to the laminate structure surface will be collected by fewer parts of the directional structure. The intensity of received light is thus a function of the direction from which light is received and the impact of sunlight on the laminate structure can be determined according to the angle of incidence.

One or more LEDs 240 may also be provided with a similar directional beam-forming structure 242 to allow the light emitted to be guided in specific directions instead of being emitted uniformly in a cone. In this way, the light can be viewed clearly at predetermined viewing angles yet is not seen at other angles.

Figure 16A:
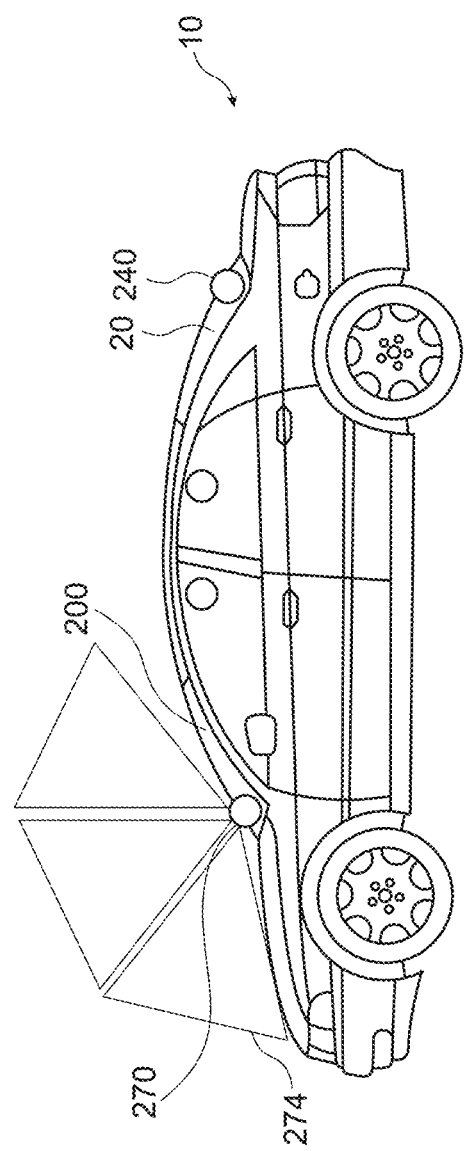
Figure 16B:
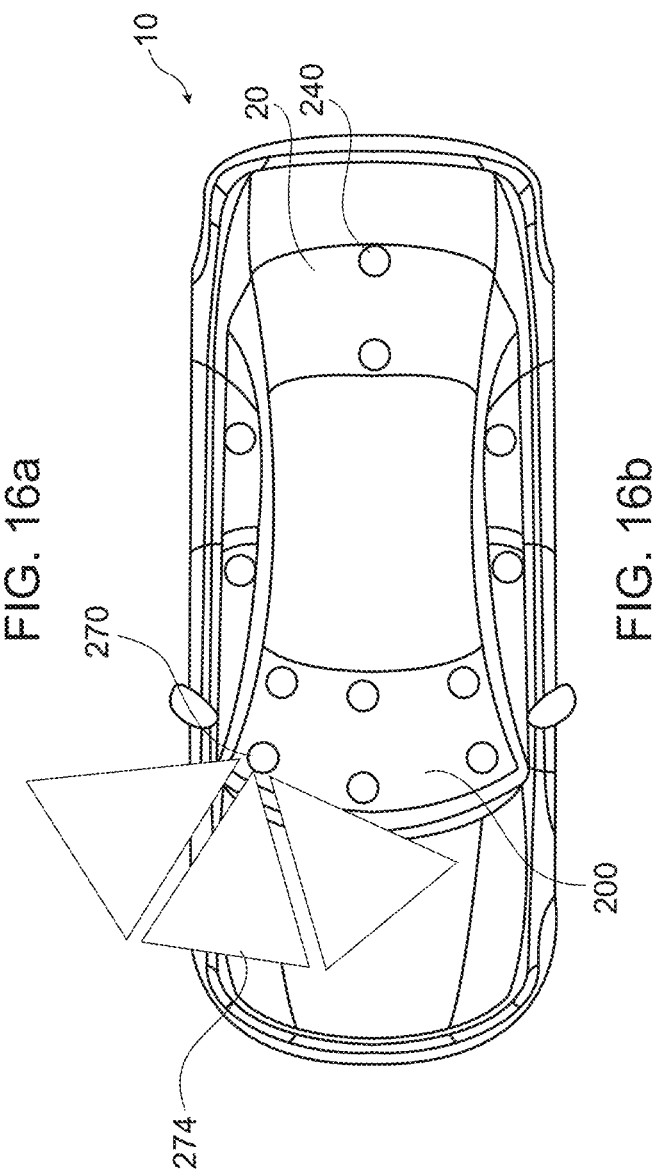
FIG. 16b schematically illustrates the disposition of temperature sensors and sunlight detectors according to an embodiment of the present invention, FIG. 17 schematically illustrates an optoelectronic arrangement according to an embodiment of the present invention, FIG. 18 schematically illustrates an optoelectronic arrangement structure according to a further embodiment of the present invention, FIG. 19 schematically illustrates an optoelectronic arrangement according to a still further embodiment of the present invention, FIGS. 20a to 20c schematically illustrate the principle of operation of the optoelectronic arrangement according to an embodiment of the present invention, FIGS. 21a to 21c schematically illustrate a further principle of operation according to an embodiment of the present invention, FIG. 22 schematically illustrates a carrier layer with optical segment structures, FIG. 23 schematically illustrates a laminate structure with optical segments as shown in FIG. 22, FIG. 24 schematically illustrates an illumination pattern obtained with the laminate structure of FIG. 23, FIG. 25 schematically illustrates a laminate structure according to a further embodiment of the present invention, FIG. 26 schematically shows a plan view of the laminate structure of FIG. 25, FIG. 27 schematically illustrates a laminate structure according to an embodiment of the present invention, and FIG. 28 schematically shows a plan view of the laminate structure of FIG. 27.

An application example of the laminate structure incorporating photodetectors 270 is shown in FIGS. 16a and 16b, which show a car in side and plane view, respectively. The car 10 has front and rear windshield and side windows 20 all of which are at least partially formed by a laminate structure 200 as described herein. Optoelectronic elements in the form of one or more LEDs 240 are located in all windows as illustrated by the dots. The laminate structure 200 forming at least part of the front windshield further includes a photodetector 270 which is associated with a directional structure 272 (not shown). The directional structure 272 channels light from different directions as illustrated by the conical directional beam shapes 274 shown in the figure. This allows the photodetector to determine the intensity of incoming radiation, or the degree of shade depending on the sum of the radiation via the different beam directions.

As for the earlier embodiments described in this document, the carrier layer 230, 230' may be provided as a single unit with a single or double conductor layer 260 and the optoelectronic elements 240, 250, 270, reflectors 252, if present, and possibly control circuits 280 mounted thereon. This element can then be incorporated into a laminate structure 200 by bonding it to intermediate lamination layers 220 with directional structures 272, and outer layer or layers 210.

FIG. 17 schematically illustrates an optoelectronic arrangement according to a further aspect of the present invention. FIG. 17 shows a laminate structure 400 including an optoelectronic arrangement for providing information, specifically information in the form of illuminated symbols, to a user in an interactive manner. The laminate structure includes a carrier layer 410 provided with electrical connections or contacts forming a conductor layer 411 for supplying power to optoelectronic components. The conductor layer 260 may be made of metal, such as silver, gold or copper, or of a substantially transparent conductive material, such as a conductive oxide, e.g. Indium Tin Oxide, or ITO. In particular when made of an opaque material, the conductor paths may have a width that is sufficiently small to render them virtually imperceptible to the human eye at a distance of 0.5 m. In general, the conductor path widths should be ≤300 nm. Electrically coupled to this conductor layer 411 are a number of optoelectronic components, specifically LED emitters 408 generating visible light of one or several colours, an infrared emitter (IR emitter) 404 and an infrared detector (IR detector) 406.

The carrier layer 410 is of a preferably flexible, substantially transparent material, and may be a thermoplastic, such as PET or similar.

As in earlier embodiments described herein, the optoelectronic components 404, 406, 408, and any associated drive circuitry and processing circuitry mounted within the laminate structure are of a size that is virtually imperceptible to the human eye when viewed from a distance of 1 m. Preferably, these components have edge dimensions of no more than 300 μm. The laminate structure is thus essentially transparent to the human eye unless the LEDs 240 are illuminated.

In some embodiments, a micro LED, also called μLED, or a μLED-chip can be used as optoelectronic component. A μLED is a small LED, for example, with edge lengths of less than 70 μm, in particular down to less than 20 μm, in particular in the range from 1 μm to 10 μm. Another range is between 10-60 μm. This can result in a surface area from a few hundred μm² to a few tens of μm². For example, a μ-LED can have a surface area of approximately 2500 μm² with an edge length of approximately 50 μm. In some cases, a μ-LED has an edge length of 5 μm or less, which results in a surface area size of less than 30 μm². Typical heights of such μ-LEDs are, for example, in the range of 1.5 μm to 10 μm.

A micro light emitting diode chip, also called μLED-chip, can be used as optoelectronic component. A micro light emitting diode can form a pixel or a subpixel and emit light of a selected colour.

The carrier layer 410 is bonded to outer layers 420 using essentially transparent bonding layers 430, which may be of PVA, for example. The outer layers 420 form the external surface of the laminate structure. The outer layers 420 are substantially transparent but may be coloured or tinted and a made of any suitable glazing material, such as glass, or a polycarbonate or acrylic (PMMA) plastic. Additional non-shown intermediate layers may be included in the laminate structure 400. The illustrated laminated structure 400 is suitable for use as a glazing element of pane or mirror of a vehicle or a building. However, the optoelectronic arrangement described herein may alternatively be used to provide an interactive lighting arrangement on a non-glazed and/or non-transparent surface, such as on the dashboard, glovebox or other interior surface of a vehicle or any suitable surface of a building. By virtue of the flexible carrier layer or layers 410, 410', the laminate structure may be applied as a substantially invisible coating or skin to multiple surfaces, including plastic or metal. The structure in such an arrangement, one of the outer layers 420 may be omitted.

The IR emitter 404 and IR detector 406 together form a proximity sensor with the IR detector detecting reflected IR radiation from objects located in proximity to the laminate structure 400. Typically, objects are detected within no more than 30 cm and preferably no more than 20 cm from the laminate structure 400 to preclude detection of random passing objects. In some cases, the IR emitter 404 and IR detector 406 are configured to detect objects within only a very close distance, of the order of 5 mm or less so that a relatively small change of position of the object can be ascertained. In this way, a sliding motion of a hand can be detected. The IR emitter 404, IR detector 406 and the LEDs 408 are connected to control circuitry or a control unit 440 that may be located on the carrier layer 410 and thus form part of the laminate structure, but in the illustrated arrangement is located externally to the laminate structure. The control unit 440 may control the operation of the IR emitter to trigger the IR emission, for example, when a vehicle is stationary, or alternatively when a vehicle is unlocked and in start. The control unit 440 further receives signals from the IR detector and, in response to a detected object in proximity to the laminate structure 400, drives the LEDs 408 to generate light in a specific pattern and/or colour to provide information to a viewer. The control unit may also control other functions of the vehicle or building, such as unlocking a door, lowering a window, or the like, either directly or by communicating with further control circuitry external to the laminate structure 400.

Turning now to FIG. 18, there is illustrated an alternative interactive laminate structure 400 in accordance with the present invention. This arrangement is similar to that shown in FIG. 17, and like reference numerals have been used for like elements. The structure 400 accordingly includes a carrier layer 410 with a conductor layer 411 and two outer layers 420 bonded to inner layers using bonding layers 430. LED emitters 408 are mounted on the carrier layer 410 and electrically coupled to the conductor layer 411. However, this structure differs from that of FIG. 17 by the provision of an additional carrier layer 410' provided with a conductor layer 411' arranged in conductive strips to form a capacitive touch sensor. The control unit 440 in this arrangement is connected either by wire or wirelessly with the LEDs 408 and the capacitive touch sensor 411' and, in response to an increase of output capacitance from the touch sensor 411', selectively controls the current to the LEDs to produce a specific pattern and/or colour to provide information to a viewer. As for the arrangement of FIG. 17, the control unit may additionally control other functions of the vehicle or building.

Turning now to FIG. 19 a further embodiment of the optoelectronic arrangement is illustrated with a different laminate structure 400. Once again, like reference numerals are used to designate like elements, so a detailed description of these elements will be omitted. In this arrangement, the laminate structure is provided with both a proximity sensor in the form of an IR emitter 404 and IR detector 406, and a capacitive touch sensor in the form of a conductive layer 411' formed in strips on an additional carrier layer 410'. The control unit 440 thus responds to both the proximity sensor 406, 408 and to the capacitive touch sensor 410', 411' to control the operation of the LEDs 408 and, possibly, other functions of the vehicle or building.

It will be appreciated that the laminate structure 400 illustrated in FIGS. 17 to 19 may contain multiple proximity sensors and/or multiple capacitive touch sensors 411' as well as any desired disposition of LEDs 408. The optoelectronic elements 404, 406, 408, 411' may also be disposed in any location and any disposition in a glazed structure and are not limited to the edge of windows.

Figure 20C:
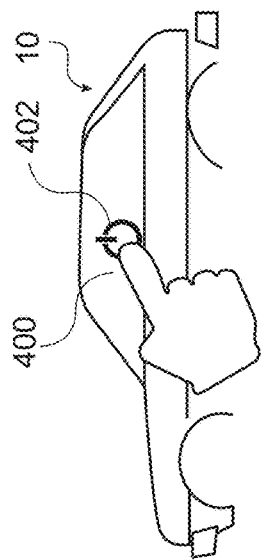
Figure 20B:
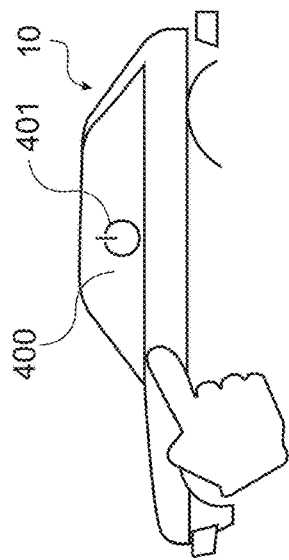
Figure 20A:
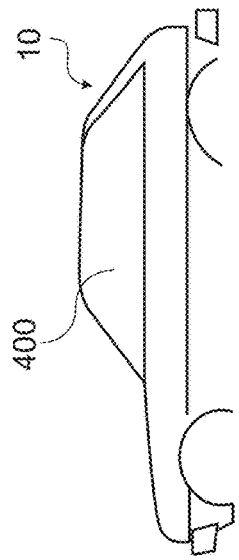

The function of the optoelectronic arrangements illustrated in FIGS. 17 to 19 is illustrated in FIGS. 20a to 20c, which show a car 10 in partial profile having windows, at least one of which comprises a laminate structure 400 with an optoelectronic arrangement in accordance with the present invention. In FIG. 17a, the windows and laminate structure 400 are transparent with no information displayed. As the user approaches the window, as symbolised by the illustrated hand, the proximity sensor 404, 406 detects the approach and signals this to the control unit 440, which drives the LEDs 408 to generate light in the form of a symbol 401 on the front side window. This symbol 401 may be in a first colour, or of a specific first shape. As the hand advances and touches the laminate structure 400, this is detected by the capacitive sensor 411' and control unit 440, which then drives the LEDs 408 to modify the displayed information. For example, the control unit may dive the LEDs to effect a change in the colour of the displayed symbol from red to green, for example, as indicated by the change from a normal symbol 401 to a bold symbol 402 in FIGS. 20b and 20c.

A modified function of the optoelectronic arrangement is illustrated in FIGS. 21a to 21c by way of a displayed control for adjusting the height of a window. FIGS. 21a to 21c each show a partial side view of a further vehicle 10, again with a front side window comprising the laminate structure 400. In FIG. 21a, no object is close to the laminate structure 400 and the window is substantially transparent with no objection visible. As shown in FIG. 21b, as the illustrate hand approaches the window to within the detectible distance, it is detected by the proximity sensor 404, 406 and the control unit 440 drives the LEDs 408 to display the desired information, in this case a graduated scale representing a slide control 403 for the position of the window. Finally in FIG. 21c, the user can adjust the height of the window by sliding or tapping a finger over the slide control to the desired position. The movement of the hand is detected, either by a capacitive touch sensor 411', or by one or more proximity sensors 404, 406, or a combination of both, and the information relayed to the control unit 440. The control unit 440 may then respond by modifying the current to the LEDs 408 to effect a change in shape and/or colour of the display. For example, the displayed slide control 402 may change colour as the finger passes it to indicate a desired degree of opening of the window as indicated by the darkened areas on the symbol 403 in FIG. 20c. In addition, the control unit 440 may generate a signal for controlling the opening or closing of the window to the indicated position.

It will be understood that the light emitting elements or light sources 408, whether LEDs or other components, may be arranged in any desired configuration on the carrier layer 410 and hence in the laminate structure (400). In other words, the light sources 408 may form single light spots, and thus be 0-dimensional, or alternatively be arranged in a 1-dimensional or a 2-dimensional configuration. By one-dimensional, it is meant that a single light spot is perceived by the viewer, but this may be generated by a group of LEDs 408 of different colours, or one of the LEDs 408 of this group.

Figures 22, 23, 24:
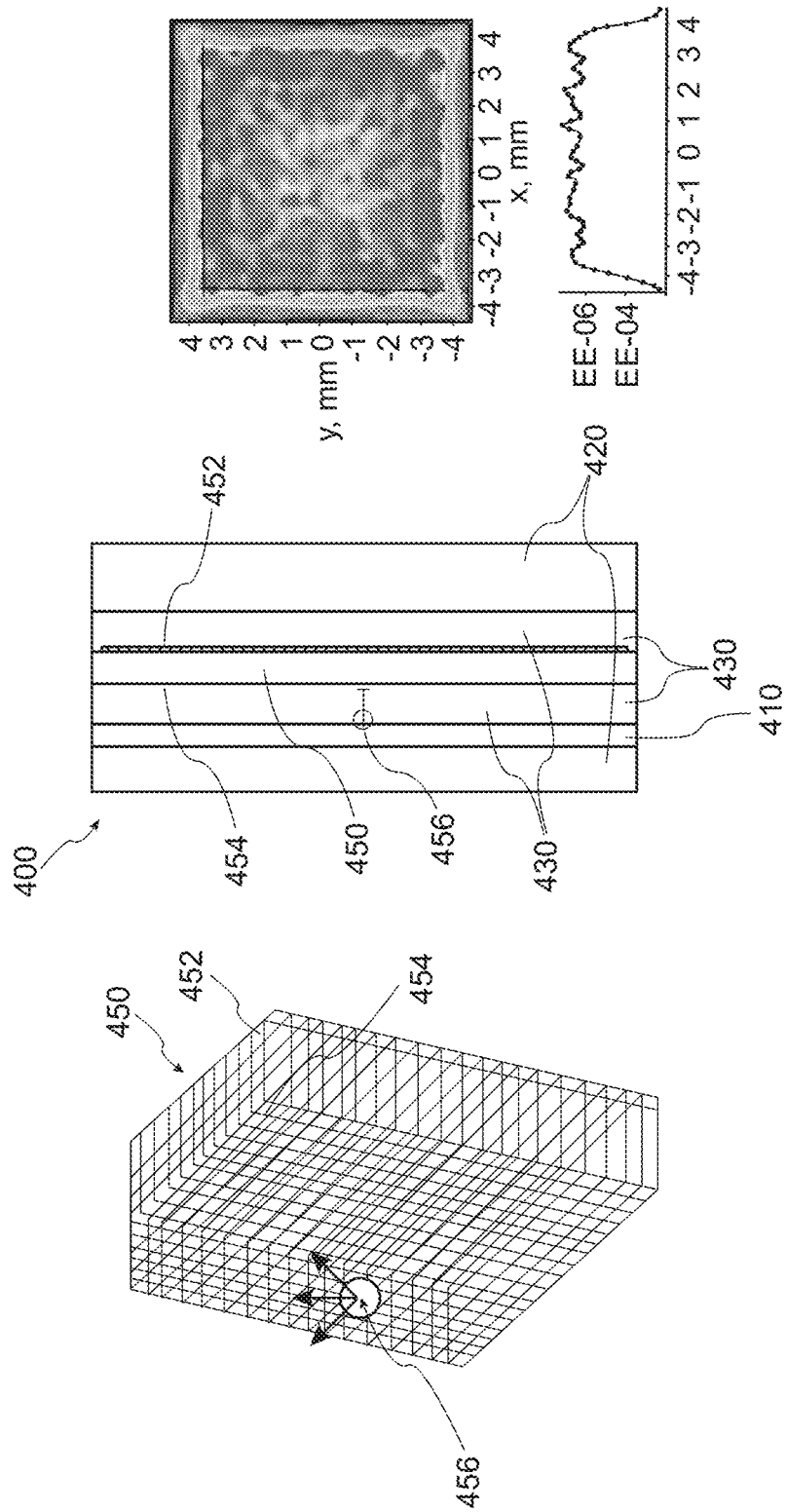

Turning now to FIG. 22 there is shown a beamforming micro optical element 450 that may be integrated in the laminate structure 400. As shown in FIG. 23, this micro optical element 450 is essentially a film or layer that can be sandwiched in the laminate structure between a carrier layer 410, on which is mounted a light source 456, which may be an LED or a laser, and an outer layer 420, possibly via one or more intermediate layers. The micro optical element 450 is formed with optical segments or cells 452, 454 on both sides. In the illustrated example, the micro optical element 450 has segments in a 2-dimensional configuration for channeling and diffusing light from a single source into a 2-dimensional field. However, it will be understood that such a beamforming element may be used for creating 1-dimensional beams also. The segments 454 on the front or light receiving surface of the optical element 450 are smaller than the segments 452 those on the light outputting surface. The segments 454, 452 are further adapted to the size and divergence of the light source 456. The micro optical element 450 has a refractive index that is higher than the surrounding material, preferably by at least 0.02. The combination of the input and output segments 454, 452 and the layer between these causes the light from the light source 456 to be diffused and deflected into a substantially uniform light patch greater than the size of the light source 456. This is illustrated in FIG. 24, which shows the homogenous illuminance achievable with the micro optical element 450. A micro optical element may be combined with any one of the embodiments described herein to facilitate the generation of a desired light symbol while limiting the number of light sources and associated circuitry required, thus improving the transparency of the laminate structure 400.

The micro optical element 450 may be fabricated by a roll-to-roll process or by lithography and UV moulding on top of the outer layer substrate.

The FIGS. 25 and 26 show a further embodiment of the optoelectronic arrangement in cross-section and plan view, respectively, in which sensors 406 and light sources 408 are arranged in a 2-dimensional array, which serves as a rudimentary interactive camera. In the illustrated laminate structure, light sources 408, which may be LEDs, and proximity sensors 406 are grouped, such that an object detected by a proximity sensor 406 of a group can cause adjustment of the light sources 408 in the same group. The proximity sensors preferably include IR emitters 404 and IR detectors 406; however, some may alternatively or additionally comprise RGB detectors for detecting ambient light levels. In this way, the illuminance of the light sources 408 can be adjusted according to the local ambient light, thus taking into account direct sunlight or shadow, as well as dimmed to adjust to low light conditions at night.

A modified configuration of the optoelectronic arrangement of FIGS. 25 and 26 is illustrated in FIGS. 27 and 28. In a cross-sectional view shown in FIG. 25 it can be seen that lens structures 460 are formed above each proximity sensor, specifically above an IR detector. These lens structures may also be formed above RGB or ambient light detectors, if present. The lenses 460 may be pre-structured in the bonding layer 430 prior to assembly of the laminate structure 400. The lenses 460 serve to limit the spatial range of the sensors 406, thus ensuring greater precision in detecting local obstacles and more precise control for each group of proximity sensor 406 and light sources 408.

In the arrangements of FIGS. 25 to 28, it is preferable that the proximity sensors 406 and/or ambient light detectors are mounted close to the light sources 408 of the same group, and that the special range of the proximity sensor is limited to the group area or just greater than the group area to avoid overlap into adjacent groups.

In the following, various devices and arrangements as well as methods for manufacturing, processing and operating are listed as Items. The following items present various aspects and implementations of the proposed principles and concepts, which can be combined in different ways. Such combinations are not limited to those given below:

Item 1: Monitoring system for monitoring the space inside and/or outside a motor vehicle comprising a plurality of photoelectric sensor elements (30) adapted to generate a 3-dimensional mapping of objects in said space, sensor elements (30) being electrically connected to a substantially transparent carrier layer (90) adapted to be disposed between first and second substantially transparent layers (70, 80) to form a substantially transparent laminate structure (20) for use in one or more windows and/or roof panel of said motor vehicle.

Item 2: Monitoring system as identified in item 1, wherein said sensor elements (30) are disposed on said carrier layer (90) in a 2-dimensional arrangement.

Item 3: Monitoring system as identified in items 1 or 2, wherein said carrier layer (90) is flexible.

Item 4: A monitoring system as identified in any previous item, wherein said sensor elements (30) are configured to monitor a space using at least one of triangulation, structured light and time-of-flight.

Item 5: A monitoring system as identified in any previous item, wherein said sensor elements (30), when mounted in said laminate structure (20) in a motor vehicle, are arranged to generate a three-dimensional detection zone (40, 50, 60) inside and/or outside said motor vehicle.

Item 6: A monitoring system as identified in any previous item wherein said sensor elements (30; 301,302,303) are mounted on said carrier layer (90).

Item 7: A monitoring system as identified in any one of items 1 to 3, wherein said sensor elements (30;301,302,303) are embedded in said carrier layer (90).

Item 8: A monitoring system as identified in any previous items wherein a bonding layer (100) is provided between said carrier layer (90) and at least one of said first and second layers (70, 80).

Item 9: A monitoring system as identified in any previous item wherein said carrier layer (90) comprises wiring for power supply and signal carrier of said sensors (30).

Item 10: A monitoring system as identified in item 9, wherein said sensors are bonded to carrier layer (90) via said wiring.

Item 11: A monitoring system as identified in any previous item, wherein said sensors (30) comprise photoelectric emitter elements (301) and photoelectric detector elements (302).

Item 12: A monitoring system as identified in item 11, wherein each said photoelectric emitter element (301) and photoelectric detector element (302) comprises at least one lens (311, 321) adapted to provide a directional field of view.

Item 13: A monitoring system as identified in item 10 or 11, wherein said sensors (30) further comprise image processing and control circuitry (330) for controlling at least one photoelectric emitter element (301) and/or photoelectric detector element (302).

Item 14: A monitoring system as identified in any previous item, wherein said sensors (30) have dimensions no greater than 500 μm, and preferably no greater than 200 μm.

Item 15: A monitoring system as identified in any previous item wherein said sensors (30) operate in infrared wavelengths.

Item 16: A transparent laminate structure for use in the windows and/or roof panel of a motor vehicle comprising a monitoring system as defined in any one of items 1 to 15.

Item 17: A vehicle comprising a transparent laminate structure as defined in item 16.

Item 18: A vehicle as defined in item 17, wherein said transparent laminate structure is comprises in at least two of a side window, a rear window, a front window and a roof panel of said motor vehicle.

Item 19: Optoelectronic arrangement for use in a transparent glazing element of a vehicle, for example, the optoelectronic arrangement comprising a substantially transparent carrier layer (230), at least one conductor layer (260) comprising conductor paths provided on at least one side of said carrier layer, optoelectronic components comprising at least a plurality of LEDs (240) arranged on the carrier layer (230) and electrically coupled to conductor paths on said conductor layer and means (250; 280) for determining the temperature of at least one of the LEDs.

Item 20: Optoelectronic arrangement as identified in item 19, further comprising means (280) for adjusting operational parameters of said optoelectronic components and at least said LEDs (240) in response to said determined temperature.

Item 21: Optoelectronic arrangement as identified in any one of items 19 or 20, wherein said means for determining the temperature of at least one LED comprises at least one temperature sensor (250) arranged on at least one side of said carrier layer (230) and electrically coupled to conductor paths on said conductor layer (230).

Item 22: Optoelectronic arrangement as identified in item 21, further comprising a reflector (252) arranged around said temperature sensor (250) for reflecting heat and/or light away from said carrier layer (230).

Item 23: Optoelectronic arrangement as identified in item 20, wherein the distance between said temperature sensor (250) and said at least one LED (240) is at most 5 cm, preferably at most 1cm and still more preferably at most 0.5 cm.

Item 24: Optoelectronic arrangement as identified in any one of items 19 to 23, wherein said means for determining the temperature of at least one LED comprises means (280) for measuring a forward voltage (Vf) of at least one LED (240).

Item 25: Optoelectronic arrangement as identified in any one of items 19 to 24, wherein said means for determining the temperature of at least one LED comprises means (280) for measuring conductivity of conductor paths in said conductor layer (260).

Item 26: Optoelectronic arrangement as identified in any one of items 19 to 25, further comprising at least one substantially transparent outer layer (210) and at least one substantially transparent intermediate layer (220) disposed between said carrier layer (230) and said at least one outer layer (210).

Item 27: Optoelectronic arrangement as identified in any one of items 19 to 26, wherein said carrier layer (230) is thermally insulating.

Item 28: Optoelectronic arrangement as identified in any one of items 19 to 23, wherein said carrier layer (230) comprises two layers (230') separated by a thermally insulating layer (232).

Item 29: Optoelectronic arrangement as identified in any one of items 19 to 28, wherein the plurality of LEDs (230) are arranged on both sides of said carrier layer (230).

Item 30: Optoelectronic arrangement as identified in any one of items 19 to 29, further comprising at least one photodetector (270) mounted on at least one side of said carrier layer for providing signals indicative of the light intensity incident on said optoelectronic arrangement.

Item 31: An optoelectronic arrangement as identified in item 30, further comprising a directional structure (242) arranged over said photodetector (270) for channeling light to said photodetector as a function of the direction of light received.

Item 32: An optoelectronic arrangement as identified in any one of items 19 to 31, further comprising a directional structure arranged over at least one LED (240), said directional structure being configured to channel light from said LED in predetermined directions.

Item 33: An optoelectronic arrangement as identified in any one of items 19 to 32, wherein the side dimensions of said LEDs and means for monitoring temperature are 300 μm.

Item 34: A carrier layer for use in a substantially transparent laminate structure forming a glazing element suitable for a vehicle, for example, said carrier layer (230) being substantially transparent and having a conductor layer with conductive paths on at least one side, a plurality of LEDs (240) mounted on at least one side and electrically coupled to conductor paths on said conductor layer (260), and means (250; 280) for determining the temperature of at least one of the LEDs.

Item 35: A carrier layer as identified in item 34, further comprising means (280) for adjusting operation of said LEDs (240) in response to said determined temperature.

Item 36: A carrier layer as identified in item 34 or 35, wherein said means for determining the temperature of at least one LED comprises at least one temperature sensor (250) arranged on at least one side of said carrier layer (230) and electrically coupled to conductor paths on said conductor layer (230).

Item 37: A vehicle comprising at least one optoelectronic arrangement as identified in any one of items 19 to 33.

Item 38: A vehicle as identified in item 37, further comprising a controller for controlling the interior temperature of said vehicle in dependence on the determined temperature of the LEDs (240).

Item 39: A method of operating an optoelectronic arrangement as identified in any one of items 19 to 33, the method comprising: determining the temperature of at least one LED; adjusting the operating parameter of said at least one LED to modifying the colour of light generated by said LED.

Item 40: A method as identified in item 39, further comprising: determining the temperature of at least one LED; adjusting the operating parameter of said at least one LED to prolong the lifespan of said LED.

Item 41: A method as identified in items 39 or 40, further comprising: determining the temperature of at least one LED; signalling the determined temperature to an external climate control controller adapted to adjust the temperature in the vicinity of said LED.

Item 42: Optoelectronic arrangement for use in a transparent glazing element of a vehicle, for example, the optoelectronic arrangement comprising at least one substantially transparent carrier layer (410), at least one conductor layer (411) comprising conductor paths provided on at least one side of said carrier layer, at least one light emitting element (408) arranged on the carrier layer (410) and electrically coupled to conductor paths on said conductor layer (411) and at least one proximity and/or touch sensor (404, 406; 411') arranged on at least one of said carrier layers (410, 410'), the arrangement further being couplable to a control module (440) for controlling the operation of said at least one light emitting element in response to information from said at least one proximity and/or touch sensor.

Item 43: Optoelectronic arrangement as identified in item 42, wherein said proximity sensor comprises at least one infrared emitter and at least one infrared detector.

Item 44: Optoelectronic arrangement as identified in item 42 or 43, wherein said touch sensor comprises a capacitive touch sensor (411').

Item 45: Optoelectronic arrangement as identified in any of the previous items 42 to 44, wherein at least one carrier layer (410') comprises conductor strips (411') serving as a capacitive touch sensor.

Item 46: Optoelectronic arrangement as identified in any of the previous items 42 to 45, wherein said control unit (440) is at least partially mounted on at least one carrier layer (410).

Item 47: Optoelectronic arrangement as identified in any of the previous items 42 to 46, further comprising a plurality of light emitting elements arranged in a 1-dimensional, preferably a 2-dimensional array, wherein at least one light emitting element is individually controllable by said control unit (440).

Item 48: Optoelectronic arrangement as identified in any of the previous items 42 to 47, wherein said at least one light emitting element comprises an LED (480), preferably a microLED.

Item 49: Optoelectronic arrangement as identified in any of the previous items 42 to 48, wherein said light emitting element comprises a laser (456).

Item 50: Optoelectronic arrangement as identified in any of the previous items 42 to 49, further comprising at least one ambient light detector mounted on said at least one carrier layer (410), said control unit (440) being configured to control the illuminance of said light sources in response to signals from said at least one ambient light detector.

Item 51: Optoelectronic arrangement as identified in any of the previous items 42 to 50, wherein at least one light emitting element (408) and at least one proximity sensor (408) are arranged in a group, said control unit being configured to control the operation of the light emitting elements of each group in response to signals from the at least one proximity sensor of the same group.

Item 52: Optoelectronic arrangement as identified in item 50, wherein each group comprises at least one ambient light detector, the control unit (440) being configured to control the illuminance of the light emitting elements of a group in response to a signal from an ambient light detector of the same group.

Item 53: Optoelectronic arrangement as identified in item 49 or 51, wherein said ambient light detector is a photodiode, preferably an RGB photodiode.

Item 54: Optoelectronic arrangement as identified in any of the previous items 42 to 53, further comprising a lens structure arranged over at least one of said proximity sensors (406).

Item 55: Optoelectronic arrangement as identified in any of the previous items 42 to 54, further comprising at least one optical layer (450) bonded to said carrier layer (410) over said light sources (456) for diffusing light from each light emitting element (456) into a light patch of substantially uniform illuminance and of greater diameter than the light source.

Item 56: Optoelectronic arrangement as identified in item 54, wherein said optical layer comprises an array of optical segments (454) on an input surface and an array of optical segments (452) on and output surface, wherein the segments (452) on the output surface are larger than the segments (454) on the input surface.

Item 57: Optoelectronic arrangement as identified in item 54, wherein said array of light segments is 1-dimensional, preferably 2-dimensional.

Item 58: Optoelectronic arrangement as identified in any of the previous items 42 to 57, wherein the side dimensions of said light emitting elements, proximity sensors and touch sensors are 300 μm.

Item 59: Optoelectronic arrangement as identified in any of the previous items 42 to 58, wherein said at least one carrier layer (410) is flexible and preferably made of a thermoplastic, such as PET.

Item 60: Optoelectronic arrangement as identified in any of the previous items 42 to 59, wherein said at least one conductor layer (411, 411') is of a substantially transparent metal oxide such as ITO.

Item 61: Optoelectronic arrangement as identified in any of the previous items 42 to 60, further comprising at least one outer layer (420), said outer layer being bonded to said at least one carrier layer by a bonding layer (430), said outer layer preferably being made of glass, a polycarbonate or PMMA.

Item 62: A vehicle comprising at least one optoelectronic arrangement as identified in any of the previous items 42 to 58.

LIST OF REFERENCE NUMERALS

10. Motor vehicle
20. Transparent laminate structure
30. Photoelectric Sensor
40. Light path
50. Detection zone
60. Detection zone
70. Front layer
80. Rear layer
90. Carrier layer
100. Bonding layer
200. Laminate structure
210. Cover layer
220. Laminating layer
230. Carrier layer
230'. Carrier layer part
232. Thermally insulating layer
240. LED
242. Directional structure
250. Temperature sensor
252. Reflector
260. Conductor layer
270. Photodetector
272. Directional structure
274. Directional beam
280. Control circuit
301. Emitter element
302. Detector element
303. Image processing circuitry
310. Semiconductor body
311. Lens
320. Semiconductor body
321. Lens
400. Laminate structure
401. Light symbol
402. Bold light symbol
403. Slide control symbol
404. IR emitter
406. IR detector
408. LED emitter
410. Carrier layer
410'Carrier layer
411. Conductor layer
411'Conductor layer
420. Outer layer
430. Bonding layer
440. Control unit
450. Micro optical element
452. Optical segments
454. Optical segments
456. Light source
460. Lens

The invention claimed is:

1. An optoelectronic arrangement for use in a transparent glazing element of a vehicle, the optoelectronic arrangement comprising:
at least one substantially transparent carrier layer;
at least one conductor layer comprising conductor paths provided on at least one side of said at least one substantially transparent carrier layer;
at least one light emitting element arranged on the at least one substantially transparent carrier layer and electrically coupled to conductor paths on said conductor layer;
at least one proximity and/or touch sensor arranged on said at least one substantially transparent carrier layer;
at least one optical layer bonded to said at least one substantially transparent carrier layer over the at least one light emitting element for diffusing light from each light emitting element into a light patch of substantially uniform illuminance and of greater diameter than the at least one light emitting element;
wherein the arrangement is couplable to a control module for controlling the operation of said at least one light emitting element in response to information from said at least one proximity and/or touch sensor; and
wherein said at least one optical layer comprises an array of optical segments on an input surface and an array of optical segments on an output surface, wherein the array of optical segments on the output surface are larger than the array of optical segments on the input surface.

2. The optoelectronic arrangement according to claim 1, wherein said proximity sensor comprises at least one infrared emitter and at least one infrared detector.

3. The optoelectronic arrangement according to claim 1, wherein said touch sensor comprises a capacitive touch sensor.

4. The optoelectronic arrangement according to claim 1, wherein said at least one substantially transparent carrier layer comprises conductor strips serving as a capacitive touch sensor.

5. The optoelectronic arrangement according to claim 1, wherein said control unit is at least partially mounted on said at least one substantially transparent carrier layer.

6. The optoelectronic arrangement according to claim 1, further comprising a plurality of light emitting elements arranged in a 1-dimensional, preferably a 2-dimensional array, wherein at least one light emitting element is individually controllable by said control unit.

7. The optoelectronic arrangement according to claim 1, wherein said at least one light emitting element comprises an LED including a microLED.

8. The optoelectronic arrangement according to claim 1, wherein said light emitting element comprises a laser.

9. The optoelectronic arrangement according to claim 1, further comprising at least one ambient light detector mounted on said at least one substantially transparent carrier layer, said control unit being configured to control the illuminance of the at least one light emitting element in response to signals from said at least one ambient light detector.

10. The optoelectronic arrangement according to claim 1, wherein at least one light emitting element and at least one proximity sensor are arranged in a group, said control unit being configured to control the operation of the light emitting elements of each group in response to signals from the at least one proximity sensor of the same group.

11. The optoelectronic arrangement according to claim 10, wherein each group comprises at least one ambient light detector, the control unit being configured to control the illuminance of the light emitting elements of a group in response to a signal from an ambient light detector of the same group.

12. The optoelectronic arrangement according to claim 11, wherein said ambient light detector is a photodiode including an RGB photodiode.

13. The optoelectronic arrangement according to claim 1, further comprising a lens structure arranged over at least one of said proximity sensor.

14. The optoelectronic arrangement according to claim 1, wherein the side dimensions of said light emitting element, proximity sensor, and touch sensor are ≤300 μm.

15. The optoelectronic arrangement according to claim 1, wherein said at least one substantially transparent carrier layer is flexible and made of a thermoplastic comprising PET.

16. The optoelectronic arrangement according to claim 1, wherein said at least one conductor layer is of a substantially transparent metal oxide comprising ITO.

17. The optoelectronic arrangement according to claim 1, further comprising at least one outer layer, said outer layer being bonded to said at least one substantially transparent carrier layer by a bonding layer, said outer layer being made of glass, a polycarbonate, or PMMA.

18. A vehicle comprising at least one optoelectronic arrangement, the optoelectronic arrangement comprising:
   at least one substantially transparent carrier layer;
   at least one conductor layer comprising conductor paths provided on at least one side of said at least one substantially transparent carrier layer;
   at least one light emitting element arranged on the at least one substantially transparent carrier layer and electrically coupled to conductor paths on said conductor layer;
   at least one proximity and/or touch sensor arranged on at least one of said at least one substantially transparent carrier layer;
   at least one optical layer bonded to said at least one substantially transparent carrier layer over the at least one light emitting element for diffusing light from each light emitting element into a light patch of substantially uniform illuminance and of greater diameter than the at least one light emitting element;
   wherein the arrangement is couplable to a control module for controlling the operation of said at least one light emitting element in response to information from said at least one proximity and/or touch sensor; and
   wherein said at least one optical layer comprises an array of optical segments on an input surface and an array of optical segments on an output surface, wherein the array of optical segments on the output surface are larger than the array of optical segments on the input surface.

19. An optoelectronic arrangement for use in a transparent glazing element of a vehicle, the optoelectronic arrangement comprising:
   at least one substantially transparent carrier layer;
   at least one conductor layer comprising conductor paths provided on at least one side of said at least one substantially transparent carrier layer;
   at least one light emitting element arranged on the at least one substantially transparent carrier layer and electrically coupled to conductor paths on said conductor layer;
   at least one proximity and/or touch sensor arranged on the at least one substantially transparent carrier layer;
   at least one ambient light detector mounted on said at least one substantially transparent carrier layer, a control unit being configured to control the illuminance of the at least one light emitting element in response to signals from said at least one ambient light detector;
   at least one optical layer bonded to said at least one substantially transparent carrier layer over the at least one light emitting element for diffusing light from each light emitting element into a light patch of substantially uniform illuminance and of greater diameter than the at least one light emitting element;
   wherein the arrangement is couplable to a control module for controlling the operation of said at least one light emitting element in response to information from said at least one proximity and/or touch sensor; and
   wherein said at least one optical layer comprises an array of optical segments on an input surface and an array of optical segments on an output surface, wherein the array of optical segments on the output surface are larger than the array of optical segments on the input surface.

20. The optoelectronic arrangement according to claim 19, wherein said array of light segments is 1-dimensional or 2-dimensional.

* * * * *